US012810753B2

(12) United States Patent
Myung et al.

(10) Patent No.: US 12,810,753 B2
(45) Date of Patent: Nov. 24, 2026

(54) DISPLAY DEVICE

(71) Applicant: Samsung Display Co., Ltd., Yongin-si (KR)

(72) Inventors: Mansik Myung, Yongin-si (KR); Sungjune Park, Yongin-si (KR); Jin Yong Sim, Yongin-si (KR); Sung Chul Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 298 days.

(21) Appl. No.: 18/777,424

(22) Filed: Jul. 18, 2024

(65) Prior Publication Data

US 2025/0166529 A1 May 22, 2025

(30) Foreign Application Priority Data

Nov. 22, 2023 (KR) ........................ 10-2023-0163354

(51) Int. Cl.

| | |
|---|---|
| ***G09F 9/30*** | (2006.01) |
| ***H10K 59/10*** | (2023.01) |
| *H10K 102/00* | (2023.01) |

(52) U.S. Cl.

CPC ............. *G09F 9/301* (2013.01); *H10K 59/10* (2023.02); *H10K 2102/311* (2023.02)

(58) Field of Classification Search

None

See application file for complete search history.

(56) References Cited

U.S. PATENT DOCUMENTS

| | | | |
|---|---|---|---|
| 10,074,824 | B2 | 9/2018 | Han et al. |
| 11,656,655 | B2 | 5/2023 | Shin et al. |
| 11,662,780 | B2 | 5/2023 | Park |
| 11,700,716 | B2 | 7/2023 | Shin et al. |

FOREIGN PATENT DOCUMENTS

| | | | |
|---|---|---|---|
| KR | 10-2018-0036904 | A | 4/2018 |
| KR | 10-2263917 | B1 | 6/2021 |
| KR | 10-2021-0096725 | A | 8/2021 |
| KR | 10-2022-0006669 | A | 1/2022 |
| KR | 10-2022-0136523 | A | 10/2022 |
| KR | 10-2023-0018001 | A | 2/2023 |
| KR | 10-2023-0044907 | A | 4/2023 |

*Primary Examiner* — Anthony Ho

(74) *Attorney, Agent, or Firm* — Womble Bond Dickinson (US) LLP

(57) ABSTRACT

Provided is a display device including a display panel including a first non-folding region, a folding region, and a second non-folding region arranged in a first direction, and a supporting plate below the display panel, and including a portion overlapping the folding region, and defining openings arranged in the first direction and in a second direction crossing the first direction, and a first branch part between adjacent ones of the openings adjacent in the second direction, and having a varying width in the first direction, or a varying thickness in a third direction crossing a plane defined by the first direction and the second direction.

20 Claims, 18 Drawing Sheets

DISPLAY DEVICE

CROSS-REFERENCE TO RELATED APPLICATIONS

The present application claims priority to, and the benefit of, Korean Patent Application No. 10-2023-0163354, filed on Nov. 22, 2023, in the Korean Intellectual Property Office, the entire disclosure of which is incorporated herein by reference.

BACKGROUND

1. Field

The present disclosure herein relates to a display device.

2. Description of the Related Art

In general, a display device includes a display module for displaying an image, and a support part for supporting the display module. The display module includes a display panel for displaying an image, a window located on the display panel to protect the display panel from an external scratch and impact, and a protection layer located under the display panel to protect the display panel from an external impact. The support part has greater rigidity than the display module, and supports the display module.

Recently, with development of display device technology, a flexible display device that may be changed into various forms has been developed. The flexible display device includes a flexible display module that may be folded or rolled. A supporting plate located below a display module, which is folded with respect to a folding axis among the flexible display module, has a structure that is folded together with the display module.

SUMMARY

The present disclosure provides a display device of which stains on a lower surface of a display panel left by a supporting plate is not visible from the outside.

One or more embodiments of the present disclosure provide a display device including a display panel including a first non-folding region, a folding region, and a second non-folding region arranged in a first direction, and a supporting plate below the display panel, and including a portion overlapping the folding region, and defining openings arranged in the first direction and in a second direction crossing the first direction, and a first branch part between adjacent ones of the openings adjacent in the second direction, and having a varying width in the first direction, or a varying thickness in a third direction crossing a plane defined by the first direction and the second direction.

The width of the first branch part in the first direction may become smaller toward a center of the first branch part between the adjacent ones of the openings adjacent in the second direction.

The openings may have a shape corresponding to two sides of the first branch part opposed in the first direction.

A dummy opening may be defined in the center of the first branch part.

The first branch part may include sub branch parts symmetrical to each other in the first direction with respect to the dummy opening, wherein a width of the sub branch parts in the first direction becomes smaller toward a center of the dummy opening.

A dummy opening may be defined in a center of the first branch part between the adjacent ones of the openings adjacent in the second direction.

The supporting plate may further include a second branch part between other adjacent ones of the openings adjacent in the first direction.

A thickness of the first branch part may be less than a thickness of the second branch part.

An upper surface of the first branch part may be lower than an upper surface of the second branch part.

A lower surface of the first branch part may be higher than a lower surface of the second branch part.

An upper surface of the first branch part may be lower than an upper surface of the second branch part, wherein a lower surface of the first branch part is higher than a lower surface of the second branch part.

In one or more embodiments of the present disclosure, a display device includes a display panel including a first non-folding region, a folding region, and a second non-folding region arranged in a first direction, and a supporting plate below the display panel, and including a portion overlapping the folding region, and defining openings in the first direction and in a second direction crossing the first direction, and a first branch part between adjacent ones of the openings adjacent in the second direction, and having an area of a cross section viewed in the second direction becoming smaller toward a center of the first branch part that is between the adjacent ones of the openings.

A width of the first branch part in the first direction may become smaller toward the center of the first branch part.

The first branch part may include sub branch parts spaced apart from each other in the first direction, wherein a dummy opening is defined by the sub branch parts.

Two sides of the first branch part opposed in the first direction may be parallel to the second direction, wherein a dummy opening is defined in the center of the first branch part.

The supporting plate may further include a second branch part between other adjacent ones of the openings adjacent in the first direction.

A thickness of the first branch part may be less than a thickness of the second branch part.

An upper surface of the first branch part may be lower than an upper surface of the second branch part.

A lower surface of the first branch part may be higher than a lower surface of the second branch part.

A height of an upper surface of the first branch part may be less than a height of an upper surface of the second branch part, wherein a lower surface of the first branch part is higher than a lower surface of the second branch part.

BRIEF DESCRIPTION OF THE DRAWINGS

The accompanying drawings are included to provide a further understanding of the present disclosure, and are incorporated in and constitute a part of this specification. The drawings illustrate embodiments of the present disclosure and, together with the description, serve to explain principles of the present disclosure. In the drawings.

DETAILED DESCRIPTION

Figure 1:
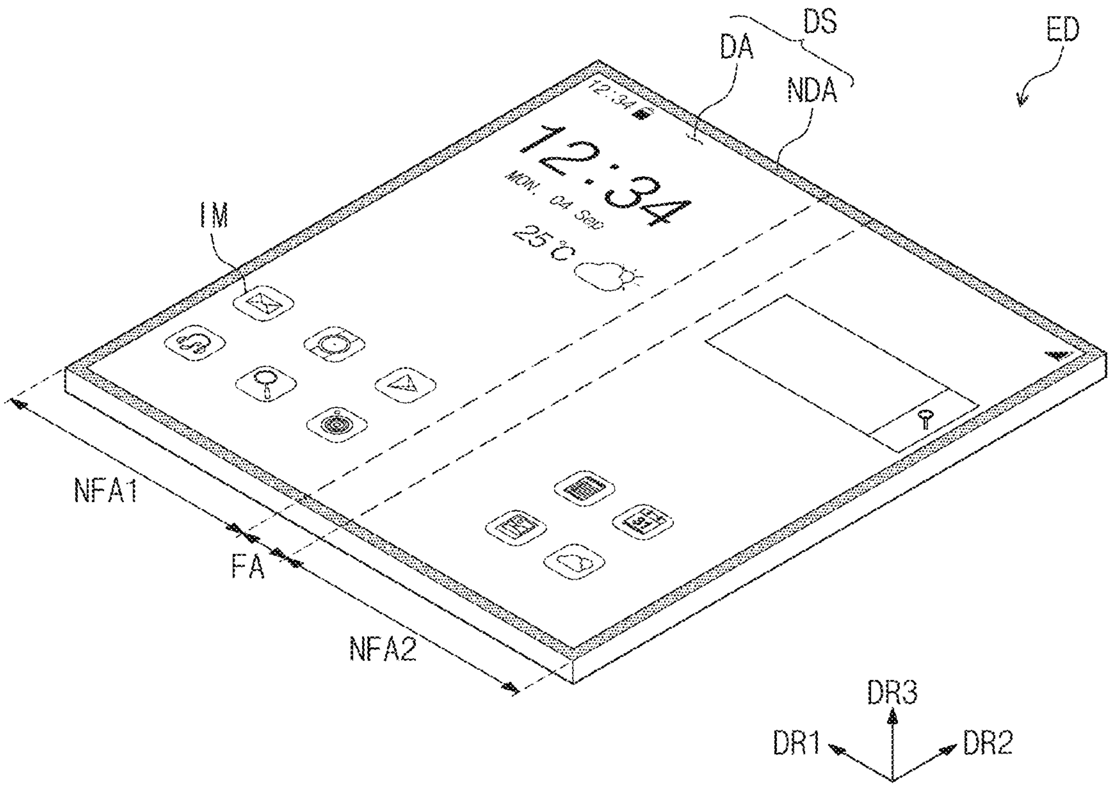
FIG. 1 is a perspective view of an electronic device according to one or more embodiments of the present disclosure.

Aspects of some embodiments of the present disclosure and methods of accomplishing the same may be understood more readily by reference to the detailed description of embodiments and the accompanying drawings. The described embodiments are provided as examples so that this disclosure will be thorough and complete, and will fully convey the aspects of the present disclosure to those skilled in the art. Accordingly, processes, elements, and techniques that are redundant, that are unrelated or irrelevant to the description of the embodiments, or that are not necessary to those having ordinary skill in the art for a complete understanding of the aspects of the present disclosure may be omitted. Unless otherwise noted, like reference numerals, characters, or combinations thereof denote like elements throughout the attached drawings and the written description, and thus, repeated descriptions thereof may be omitted.

The described embodiments may have various modifications and may be embodied in different forms, and should not be construed as being limited to only the illustrated embodiments herein. The use of "can," "may," or "may not" in describing an embodiment corresponds to one or more embodiments of the present disclosure.

A person of ordinary skill in the art would appreciate, in view of the present disclosure in its entirety, that the present disclosure covers all modifications, equivalents, and replacements within the idea and technical scope of the present disclosure, that each of the features of embodiments of the present disclosure may be combined with each other, in part or in whole, and technically various interlocking and operating are possible, and that each embodiment may be implemented independently of each other, or may be implemented together in an association, unless otherwise stated or implied.

In the drawings, the relative sizes of elements, layers, and regions may be exaggerated for clarity and/or descriptive purposes. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result of, for example, manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the illustrated shapes of elements, layers, or regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place.

Spatially relative terms, such as "beneath," "below," "lower," "lower side," "under," "above," "upper," "upper side," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below," "beneath," "or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, the phrase "in a plan view" means when an object portion is viewed from above, and the phrase "in a schematic cross-sectional view" means when a schematic cross-section taken by vertically cutting an object portion is viewed from the side. The terms "overlap" or "overlapped" mean that a first object may be above or below or to a side of a second object, and vice versa. Additionally, the term "overlap" may include stack, face or facing, extending over, covering, or partly covering or any other suitable term as would be appreciated and understood by those of ordinary skill in the art. The expression "not overlap" may include meaning, such as "apart from" or "set aside from" or "offset from" and any other suitable equivalents as would be appreciated and understood by those of ordinary skill in the art. The terms "face" and "facing" may mean that a first object may directly or indirectly oppose a second object. In a case in which a third object intervenes between a first and second object, the first and second objects may be understood as being indirectly opposed to one another, although still facing each other.

It will be understood that when an element, layer, region, or component is referred to as being "formed on," "on," "connected to," or "(operatively or communicatively) coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. In addition, this may collectively mean a direct or indirect coupling or connection and an integral or non-integral coupling or connection. For example, when a layer, region, or component is referred to as being "electrically connected" or "electrically coupled" to another layer, region, or component, it can be directly electrically connected or coupled to the other layer, region, and/or component or one or more intervening layers, regions, or components may be present. The one or more intervening components may include a switch, a resistor, a capacitor, and/or the like. In describing embodiments, an expression of connection indicates electrical connection unless explicitly described to be direct connection, and "directly connected/directly coupled," or "directly on," refers to one component directly connecting or coupling another component, or being on another component, without an intermediate component.

In addition, in the present specification, when a portion of a layer, a film, an area, a plate, or the like is formed on another portion, a forming direction is not limited to an upper direction but includes forming the portion on a side surface or in a lower direction. On the contrary, when a portion of a layer, a film, an area, a plate, or the like is formed "under" another portion, this includes not only a case where the portion is "directly beneath" another portion but also a case where there is further another portion between the portion and another portion. Meanwhile, other expressions describing relationships between components, such as "between," "immediately between" or "adjacent to" and "directly adjacent to," may be construed similarly. It will be understood that when an element or layer is referred to as being "between" two elements or layers, it can be the only element or layer between the two elements or layers, or one or more intervening elements or layers may also be present.

For the purposes of this disclosure, expressions such as "at least one of," or "any one of," or "one or more of" when preceding a list of elements, modify the entire list of elements and do not modify the individual elements of the list. For example, "at least one of X, Y, and Z," "at least one of X, Y, or Z," "at least one selected from the group consisting of X, Y, and Z," and "at least one selected from the group consisting of X, Y, or Z" may be construed as X only, Y only, Z only, any combination of two or more of X, Y, and Z, such as, for instance, XYZ, XYY, YZ, and ZZ, or any variation thereof. Similarly, the expressions "at least one of A and B" and "at least one of A or B" may include A, B, or A and B. As used herein, "or" generally means "and/or," and the term "and/or" includes any and all combinations of one or more of the associated listed items. For example, the expression "A and/or B" may include A, B, or A and B. Similarly, expressions such as "at least one of," "a plurality of," "one of," and other prepositional phrases, when preceding a list of elements, modify the entire list of elements and do not modify the individual elements of the list.

It will be understood that, although the terms "first," "second," "third," etc., may be used herein to describe various elements, components, regions, layers and/or sections, these elements, components, regions, layers and/or sections should not be limited by these terms. These terms do not correspond to a particular order, position, or superiority, and are used only used to distinguish one element, member, component, region, area, layer, section, or portion from another element, member, component, region, area, layer, section, or portion. Thus, a first element, component, region, layer or section described below could be termed a second element, component, region, layer or section, without departing from the spirit and scope of the present disclosure. The description of an element as a "first" element may not require or imply the presence of a second element or other elements. The terms "first," "second," etc. may also be used herein to differentiate different categories or sets of elements. For conciseness, the terms "first," "second," etc. may represent "first-category (or first-set)," "second-category (or second-set)," etc., respectively.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing embodiments only and is not intended to be limiting of the present disclosure. As used herein, the singular forms "a" and "an" are intended to include the plural forms as well, while the plural forms are also intended to include the singular forms, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

As used herein, the term "substantially," "about," "approximately," and similar terms are used as terms of approximation and not as terms of degree, and are intended to account for the inherent deviations in measured or calculated values that would be recognized by those of ordinary skill in the art. For example, "substantially" may include a range of +/−5% of a corresponding value. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

In some embodiments well-known structures and devices may be described in the accompanying drawings in relation to one or more functional blocks (e.g., block diagrams), units, and/or modules to avoid unnecessarily obscuring various embodiments. Those skilled in the art will understand that such block, unit, and/or module are/is physically implemented by a logic circuit, an individual component, a microprocessor, a hard wire circuit, a memory element, a line connection, and other electronic circuits. This may be formed using a semiconductor-based manufacturing technique or other manufacturing techniques. The block, unit, and/or module implemented by a microprocessor or other similar hardware may be programmed and controlled using software to perform various functions discussed herein, optionally may be driven by firmware and/or software. In addition, each block, unit, and/or module may be implemented by dedicated hardware, or a combination of dedicated hardware that performs some functions and a processor (for example, one or more programmed microprocessors and related circuits) that performs a function different from those of the dedicated hardware. In addition, in some embodiments, the block, unit, and/or module may be physically separated into two or more interact individual blocks, units, and/or modules without departing from the scope of the present disclosure. In addition, in some embodiments, the block, unit and/or module may be physically combined into more complex blocks, units, and/or modules without departing from the scope of the present disclosure.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Hereinafter, embodiments of the present disclosure will be described in more detail with reference to the accompanying drawings.

Figure 2A:
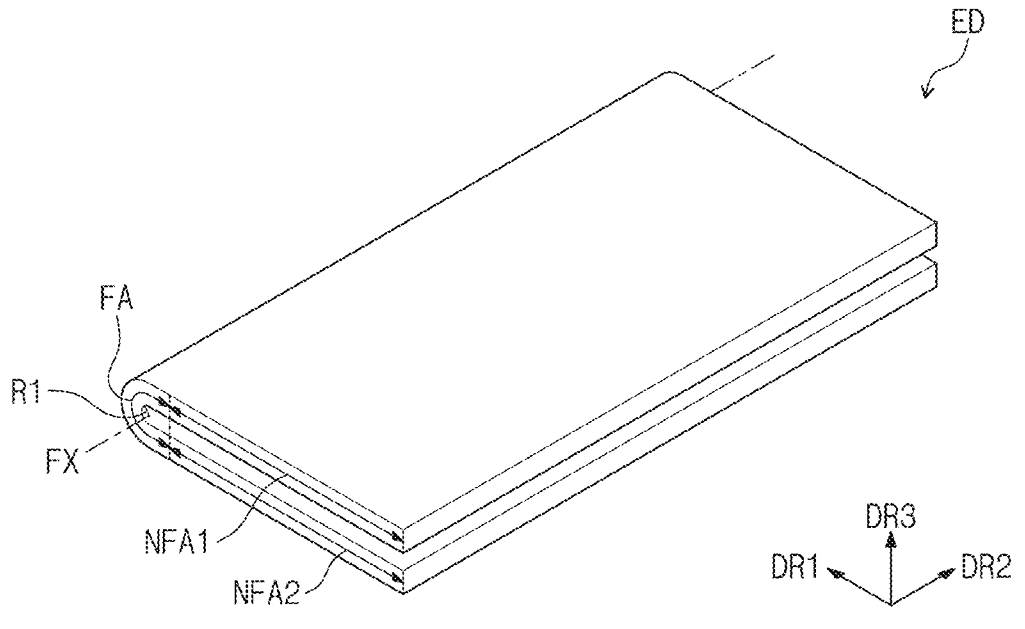
FIGS. 2A and 2B illustrate that the electronic device in FIG. 1 is folded.
Figure 2B:
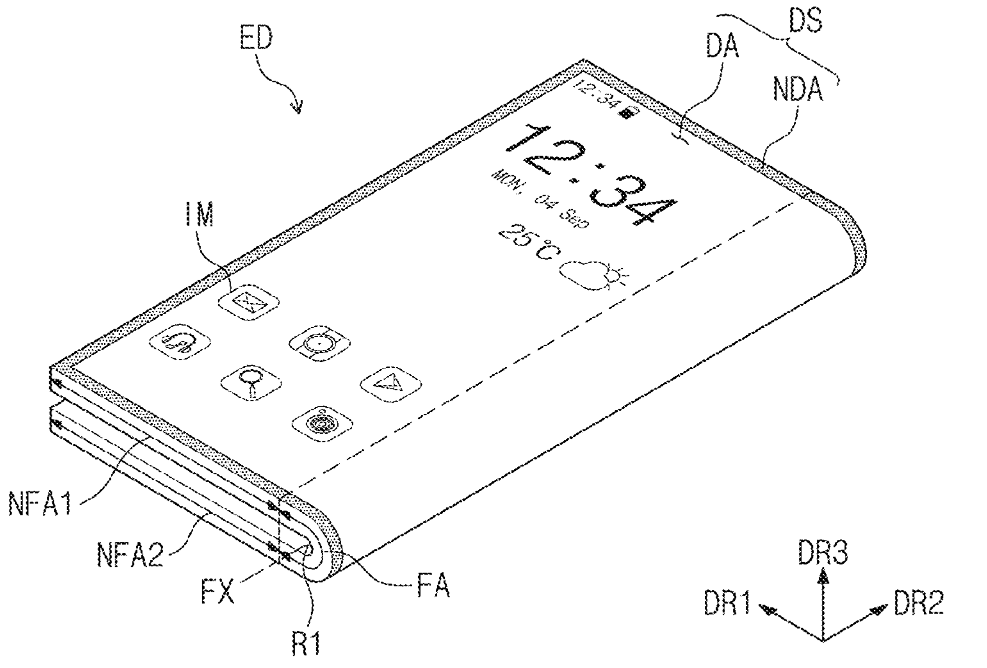

FIG. 1 is a perspective view of an electronic device according to one or more embodiments of the present disclosure. FIGS. 2A and 2B illustrate that the electronic device in FIG. 1 is folded.

Referring to FIG. 1, an electronic device ED according to one or more embodiments of the present disclosure may have a rectangular shape having short sides extending in a first direction DR1, and long sides extending in a second direction DR2 crossing the first direction DR1. However, the present disclosure is not limited thereto, and the electronic device ED may have various shapes such as a circle and a polygon. The electronic device ED may be flexible.

Hereinafter, a direction, which substantially perpendicularly crosses a plane defined by the first direction DR1 and the second direction DR2, is defined as a third direction DR3. In addition, as used herein, the wording "in a plan view" may be defined as a state of being viewed in the third direction DR3.

The electronic device ED may include a folding region FA and a plurality of non-folding regions NFA1 and NFA2. The non-folding regions NFA1 and NFA2 may include a first non-folding region NFA1 and a second non-folding region NFA2. The folding region FA may be located between the first non-folding region NFA1 and the second non-folding region NFA2. The folding region FA, the first non-folding region NFA1, and the second non-folding region NFA2 may be arranged in the first direction DR1.

One folding region FA and two non-folding regions NFA1 and NFA2 are illustrated as an example, but the number of the folding region FA and the number of the non-folding regions NFA1 and NFA2 are not limited thereto. For example, the electronic device ED may include more than two non-folding regions and a plurality of folding regions located between the non-folding regions.

An upper surface of the electronic device ED may be defined as a display surface DS, and the display surface DS may have a plane defined by the first direction DR1 and the second direction DR2. Images IM generated from the electronic device ED may be provided to a user through the display surface DS.

The display surface DS may include a display region DA, and a non-display region NDA around the display region DA. The display region DA may display an image, and the non-display region NDA may not display an image. The non-display region NDA may surround the display region DA (e.g., in plan view), and may define an edge of the electronic device ED printed in a color (e.g., predetermined color).

Referring to FIGS. 2A and 2B, the electronic device ED may be a foldable electronic device ED that may be folded or unfolded. For example, the folding region FA may be bent with respect to a folding axis FX parallel to a second direction DR2, and the electronic device ED may thus be folded. The folding axis FX may be defined as a long axis that is parallel to a long side of the electronic device ED. When the electronic device ED is folded, the electronic device ED may be in-folded so that the first non-folding region NFA1 and the second non-folding region NFA2 may face each other, and so that the display surface DS is not exposed to the outside. However, the present disclosure is not limited thereto. For example, as illustrated in FIG. 2B, the electronic device ED may be out-folded with respect to the folding axis FX so that the display surface DS is exposed to the outside. In addition, in one or more embodiments, the electronic device ED may be both in-folded and out-folded.

Figure 3:
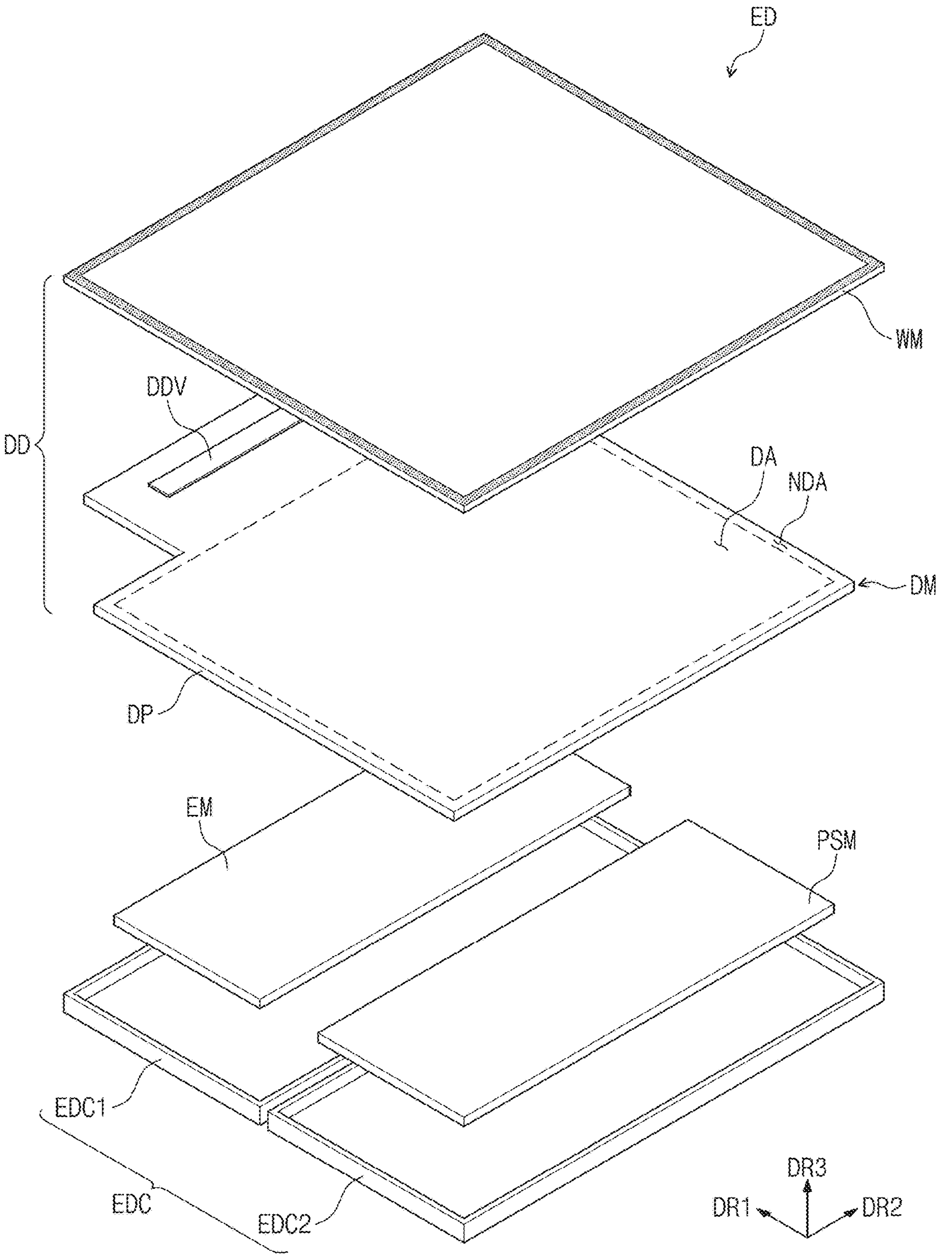
FIG. 3 is an exploded perspective view of the electronic device in FIG. 1.

FIG. 3 is an exploded perspective view of the electronic device in FIG. 1.

Referring to FIG. 3, the electronic device ED may include a display device DD, an electronic module EM, a power module PSM, and a case EDC. In one or more embodiments, the electronic device ED may further include a mechanical structure (e.g., a hinge) for controlling a folding operation of the display device DD.

The display device DD may generate an image, and may sense an external input. The display device DD may include a window module WM and a display module DM. The window module WM may provide a front surface of the electronic device ED. The window module WM may be located on the display module DM to protect the display module DM (as used herein, "located on" may mean "above"). The window module WM may transmit light generated from the display module DM, and may provide the light to a user.

The display module DM may include a display panel DP. Among stacked structures of the display module DM, only the display panel DP is illustrated in FIG. 3, but the display module DM may substantially further include a plurality of components located on an upper side and a lower side of the display panel DP. A detailed stacked structure of the display module DM will be described in detail below. The display panel DP may include a display region DA and a non-display region NDA respectively corresponding to the display region DA and the non-display region NDA in FIG. 1 of the electronic device ED.

The display module DM may include a data driver DDV at the non-display region NDA of the display panel DP. The data driver DDV may be manufactured in a form of an integrated circuit chip, and may be mounted on the non-display region NDA. However, the present disclosure is not limited thereto, and the data driver DDV may be mounted on a flexible circuit board connected to the display panel DP.

The electronic module EM and the power module PSM may be located below the display device DD. In one or more embodiments, the electronic module EM and the power module PSM may be connected to each other through a separate flexible circuit board. The electronic module EM may control an operation of the display device DD. The power module PSM may supply power to the electronic module EM.

The case EDC may accommodate the display device DD, the electronic module EM, and the power module PSM. The case EDC may include first and second cases EDC1 and EDC2 as two cases to fold the display device DD. The first and second cases EDC1 and EDC2 may extend in a second direction DR2, and may be arranged in a first direction DR1.

In one or more embodiments, the electronic device ED may further include a hinge structure for connecting the first and second cases EDC1 and EDC2. The case EDC may be coupled to the window module WM. The case EDC may protect the display device DD, the electronic module EM, and the power module PSM.

Figure 4:
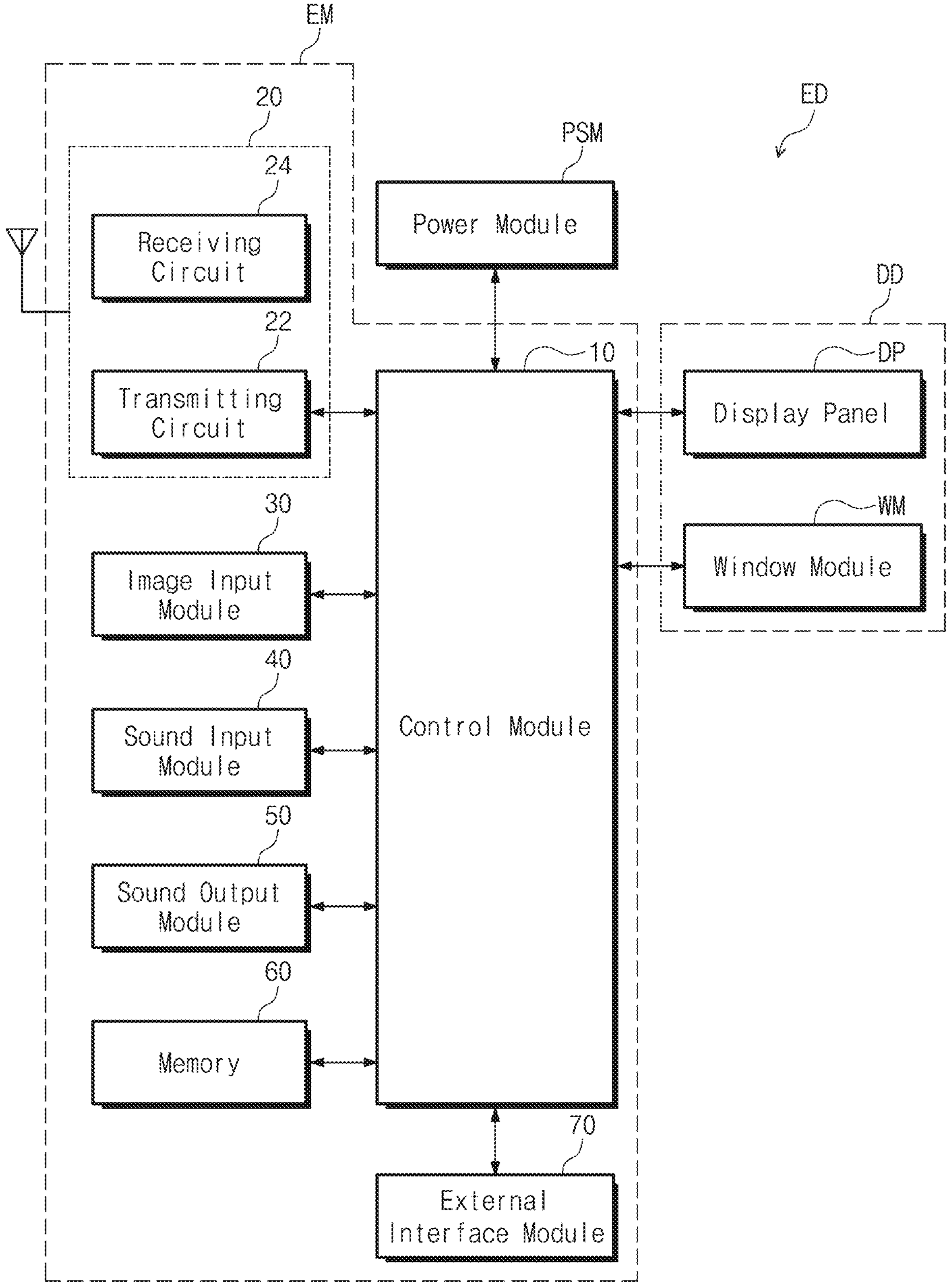
FIG. 4 is a block diagram of an electronic device in FIG. 3.

FIG. 4 is a block diagram of an electronic device in FIG. 3.

Referring to FIG. 4, the electronic device ED may include the electronic module EM, the power module PSM, and the display device DD. The electronic module EM may include a control module 10, a wireless communication module 20, an image input module 30, a sound input module 40, a sound output module 50, a memory 60, an external interface module 70, and the like. The modules may be mounted on a circuit board or electrically connected through a flexible circuit board. The electronic module EM may be electrically connected to the power module PSM.

The control module 10 may control an overall operation of the electronic device ED. For example, the control module 10 may activate or deactivate the display device DD in response to a user's input. The control module 10 may control the image input module 30, the sound input module 40, the sound output module 50, and the like in response to a user's input. The control module 10 may include at least one microprocessor.

The wireless communication module 20 may transmit/receive a wireless signal to/from another terminal via Bluetooth® or Wi-Fi® (Bluetooth® being a registered trademark of Bluetooth Sig, Inc., Kirkland, WA, and Wi-Fi® being a registered trademark of the non-profit Wi-Fi Alliance). The wireless communication module 20 may transmit/receive a voice signal via a general communication line. The wireless communication module 20 may include a transmitting circuit 22 for modulating and transmitting a signal to be transmitted, and a receiving circuit 24 for demodulating a received signal.

The image input module 30 may process an image signal, and may convert the image signal to image data that may be displayed on the display device DD. The sound input module 40 may receive an external sound signal through a microphone in a recording mode, a voice recognition mode, or the like, and may convert the external sound signal to electrical voice data. The sound output module 50 may convert sound data received from the wireless communication module 20 or sound data stored in the memory 60, and may output the converted sound data to the outside.

The external interface module 70 may serve as an interface that is connected to an external charger, a wired/wireless data port, a card socket (e.g., a memory card, a SIM/UIM card), and the like.

The power module PSM may supply power that is required for an overall operation of the electronic device ED. The power module PSM may include a typical battery device.

Figure 5:
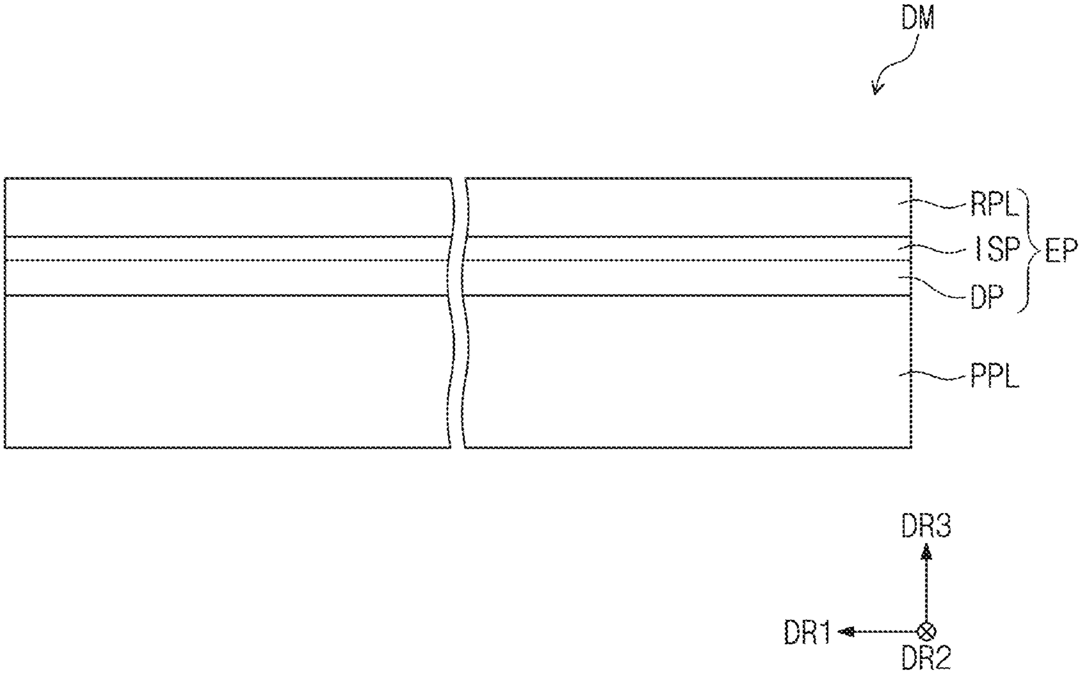
FIG. 5 is a schematic cross-sectional view of a display module in FIG. 3.

FIG. 5 is a schematic cross-sectional view of the display module in FIG. 3.

Referring to FIG. 5, the display module DM may include the display panel DP, an input-sensing part ISP located on/above the display panel DP, an anti-reflective layer RPL located on the input-sensing part ISP, and a panel protective layer PPL located under the display panel DP. The display panel DP may be a flexible display panel. For example, the display panel DP may include a flexible substrate and a plurality of elements located on the flexible substrate.

The display panel DP according to one or more embodiments of the present disclosure may be an emissive display panel, but one or more embodiments of the present disclosure is not particularly limited thereto. For example, the display panel DP may be an organic light-emitting display panel or an inorganic light-emitting display panel. A light-emitting layer of the organic light-emitting display panel may include an organic light-emitting material. A light-emitting layer of the inorganic light-emitting display panel may include quantum dots, quantum rods, etc. Hereinafter, the display panel DP will be described as an organic light-emitting display panel.

In one or more embodiments, the input-sensing part ISP may include a plurality of sensor parts for sensing an external input by using a capacitive method. When the display module DM is manufactured, the input-sensing part ISP may be formed directly on the display panel DP.

The anti-reflective layer RPL may be located on the input-sensing part ISP. When the display module DM is manufactured, the anti-reflective layer RPL may be formed directly on the input-sensing part ISP. The anti-reflective layer RPL may be defined as a film for reducing or preventing external light reflection. The anti-reflective layer RPL may reduce a reflectance for external light incident to the display panel DP from above the display device DD.

The input-sensing part ISP may be formed directly on the display panel DP, and the anti-reflective layer RPL may be formed directly on the input-sensing part ISP, but the present disclosure is not limited thereto. For example, the input-sensing part ISP may be separately manufactured and attached onto the display panel DP through an adhesive layer, and the anti-reflective layer RPL may be separately manufactured and attached onto the input-sensing part ISP through an adhesive layer.

The display panel DP, the input-sensing part ISP, and the anti-reflective layer RPL may be defined as an electronic panel EP.

The panel protective layer PPL may be located under the display panel DP. The panel protective layer PPL may protect a lower portion of the display panel DP. The panel protective layer PPL may include a flexible plastic material. For example, the panel protective layer PPL may include polyethylene terephthalate (PET).

Figure 6:
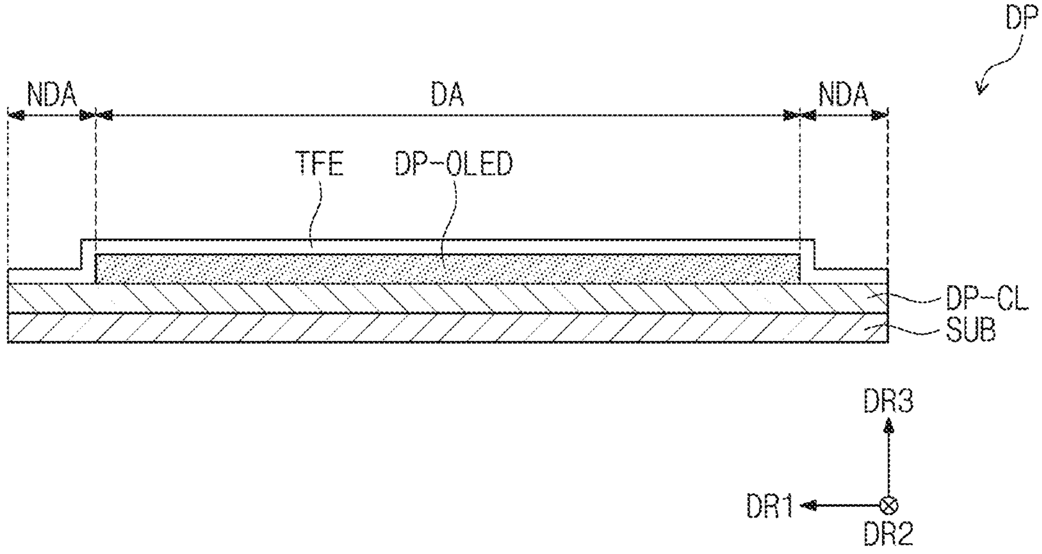
FIG. 6 illustrates a cross section of a display panel in FIG. 5.

FIG. 6 illustrates a cross section of the display panel in FIG. 5. FIG. 6 illustrates a cross section of the display panel DP viewed in a second direction DR2.

Referring to FIG. 6, the display panel DP may include a substrate SUB, a circuit element layer DP-CL located on the substrate SUB, a display element layer DP-OLED located on the circuit element layer DP-CL, and a thin-film encapsulation layer TFE located on the display element layer DP-OLED.

The substrate SUB may include a display region DA, and a non-display region NDA around the display region DA. The substrate SUB may include a flexible plastic material, such as glass or polyimide (PI). The display element layer DP-OLED may be located in the display region DA.

A plurality of pixels may be located in the circuit element layer DP-CL and the display element layer DP-OLED. Each of the pixels may include a transistor located in the circuit element layer DP-CL, and a light-emitting element located in the display element layer DP-OLED and connected to the transistor. The configuration of a pixel will be described in detail with reference to FIG. 8.

The thin-film encapsulation layer TFE may be located on the circuit element layer DP-CL to cover the display element layer DP-OLED. The thin-film encapsulation layer TFE may protect the pixels from moisture, oxygen, and external foreign substances.

Figure 7:
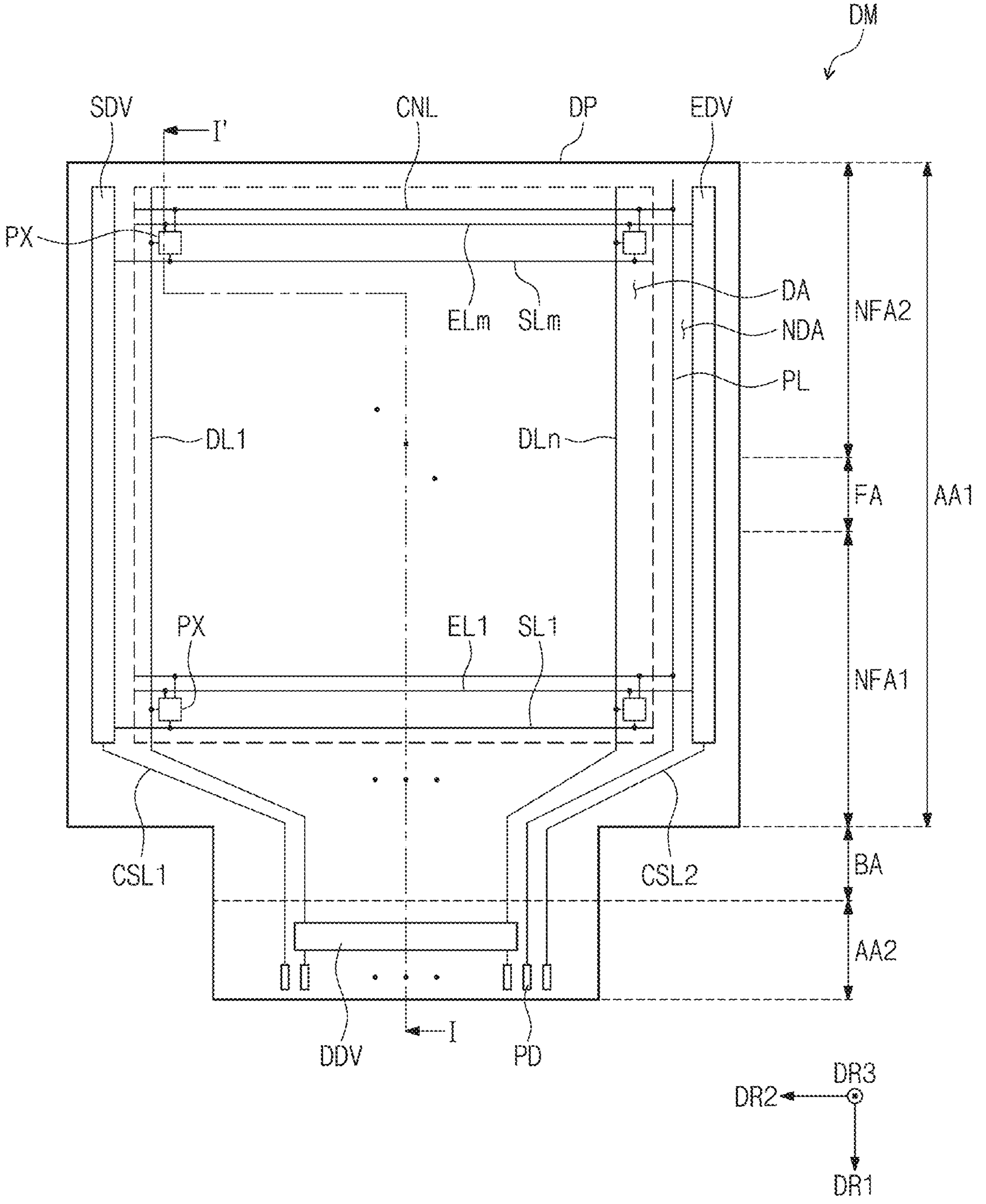
FIG. 7 is a plan view of a display panel in FIG. 3.

FIG. 7 is a plan view of the display panel in FIG. 3.

Referring to FIG. 7, a display module DM may include the display panel DP, a scan driver SDV, a data driver DDV, and an emission driver EDV.

The display panel DP may include a first region AA1, a second region AA2, and a bending region BA between the first region AA1 and the second region AA2. The bending region BA may extend in a second direction DR2, and the first region AA1, the bending region BA, and the second region AA2 may be arranged in a first direction DR1.

The first region AA1 may include a display region DA, and a non-display region NDA around the display region DA. The non-display region NDA may surround the display region DA (e.g., in plan view). The display region DA may be a region where an image is displayed, and the non-display region NDA may be a region where an image is not displayed. The second region AA2 and the bending region BA may be a region where an image is not displayed.

When viewed in the second direction DR2, the first region AA1 may include a first non-folding region NFA1, a second non-folding region NFA2, and a folding region FA between the first non-folding region NFA1 and the second non-folding region NFA2.

The display panel DP may include a plurality of pixels PX, a plurality of scan lines SL1 to SLm, a plurality of data lines DL1 to DLn, a plurality of emission lines EL1 to ELm, first and second control lines CSL1 and CSL2, a power line PL, a plurality of connection lines CNL, and a plurality of pads PD (m and n being natural numbers). The pixels PX may be located in the display region DA, and may be connected to the scan lines SL1 to SLm, to the data lines DL1 to DLn, and to the emission lines EL1 to ELm.

The scan driver SDV and the emission driver EDV may be located in the non-display region NDA. The scan driver SDV and the emission driver EDV may be located in sections of the non-display region NDA respectively adjacent to two sides of the first region AA1 opposed to each other in the second direction DR2. The data driver DDV may be located in the second region AA2. The data driver DDV may be manufactured in a form of an integrated circuit chip, and may be mounted on the second region AA2.

The scan lines SL1 to SLm may extend in the second direction DR2, and may be connected to the scan driver SDV. The data lines DL1 to DLn may extend in a first direction DR1, and may be connected to the data driver DDV via the bending region BA. The emission lines EL1 to ELm may extend in the second direction DR2, and may be connected to the emission driver EDV.

The power line PL may extend in the first direction DR1, and may be located in the non-display region NDA. The power line PL may be located between the display region DA and the emission driver EDV, but the present disclosure is not limited thereto, and the power line PL may also be, or instead may be, located between the display region DA and the scan driver SDV.

The power line PL may extend to the second region AA2 via the bending region BA. In a plan view, the power line PL may extend toward a lower end of the second region AA2. The power line PL may receive a driving voltage.

The connection lines CNL may extend in the second direction DR2, and may be arranged in the first direction DR1. The connection lines CNL may be connected to the power line PL and the pixels PX. The driving voltage may be applied to the pixels PX through the connection lines CNL and the power line PL connected to each other.

The first control line CSL1 may be connected to the scan driver SDV, and may extend toward the lower end of the second region AA2 via the bending region BA. The second control line CSL2 may be connected to the emission driver EDV, and may extend toward the lower end of the second region AA2 via the bending region BA. The data driver DDV may be located between the first control line CSL1 and the second control line CSL2.

In a plan view, the pads PD may be adjacent to the lower end of the second region AA2. The data driver DDV, the power line PL, the first control line CSL1, and the second control line CSL2 may be connected to the pads PD.

The data lines DL1 to DLn may be connected to corresponding pads PD through the data driver DDV. For example, the data lines DL1 to DLn may be connected to the data driver DDV, and the data driver DDV may be connected to pads PD respectively corresponding to the data lines DL1 to DLn.

In one or more embodiments, a printed circuit board may be connected to the pads PD, and a timing controller and a voltage generator may be located on the printed circuit board. The timing controller may be manufactured as an integrated circuit chip and mounted on the printed circuit board. The timing controller and the voltage generator may be connected to the pads PD through the printed circuit board.

The timing controller may control an operation of the scan driver SDV, the data driver DDV, and the emission driver EDV. The timing controller may generate a scan control signal, a data control signal, and an emission control signal in response to control signals received from the outside. The voltage generator may generate the driving voltage.

The scan control signal may be provided to the scan driver SDV through the first control line CSL1. The emission control signal may be provided to the emission driver EDV through the second control line CSL2. The data control signal may be provided to the data driver DDV. The timing controller may receive image signals from the outside, may convert data formats of the image signals to comply with specifications of interface with the data driver DDV, and may provide the converted image signals to the data driver DDV.

The scan driver SDV may generate a plurality of scan signals in response to the scan control signal. The scan signals may be applied to the pixels PX through the scan lines SL1 to SLm. The scan signals may be sequentially applied to the pixels PX.

The data driver DDV may generate, in response to the data control signal, a plurality of data voltages corresponding to the image signals. The data voltages may be applied to the pixels PX through the data lines DL1 to DLn. The emission driver EDV may generate a plurality of emission signals in response to the emission control signal. The emission signals may be applied to the pixels PX through the emission lines EL1 to ELm.

The pixels PX may receive the data voltages in response to the scan signals. The pixels PX may display an image by emitting light having luminance corresponding to the data voltages in response to the emission signals. An emission time of the pixels PX may be controlled by the emission signals.

Figure 8:
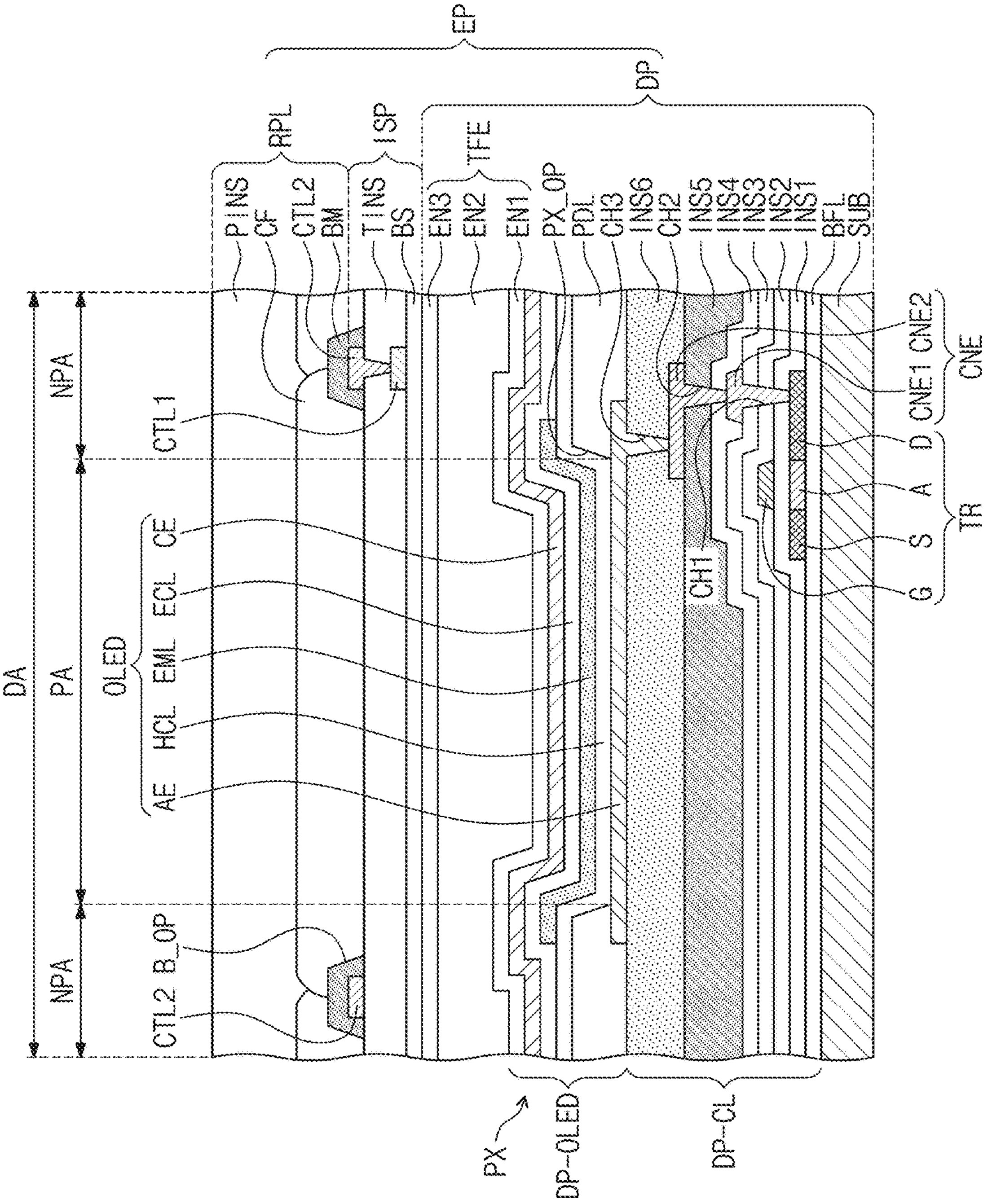
FIG. 8 illustrates a cross section of an electronic panel corresponding to one pixel in FIG. 7.

FIG. 8 illustrates a cross section of an electronic panel corresponding to one pixel in FIG. 7.

Referring to FIG. 8, the pixel PX may include a transistor TR and a light-emitting element OLED. The light-emitting element OLED may include a first electrode AE (or an anode), a second electrode CE (or a cathode), a hole control layer HCL, an electron control layer ECL, and a light-emitting layer EML.

The transistor TR and the light-emitting element OLED may be located on a substrate SUB (as used herein, "located on" may mean "above"). A single transistor TR is illustrated as an example, but the pixel PX may include a plurality of transistors and at least one capacitor for driving the light-emitting element OLED.

A display region DA may include a light-emitting region PA corresponding to each of the pixels PX, and a non-light-emitting region NPA around the light-emitting region PA. The light-emitting element OLED may be located in the light-emitting region PA.

A buffer layer BFL may be located on the substrate SUB, and the buffer layer BFL may be an inorganic layer. A semiconductor pattern may be located on the buffer layer BFL. The semiconductor pattern may include polysilicon, amorphous silicon, or metal oxide.

The semiconductor pattern may be doped with an N-type dopant or a P-type dopant. The semiconductor pattern may include a heavily doped region and a lightly doped region. The heavily doped region may have a higher conductivity than the lightly doped region, and may substantially serve as a source electrode and a drain electrode of the transistor TR. The lightly doped region may substantially correspond to an active (or channel) of the transistor.

A source S, an active A, and a drain D of the transistor TR may be formed from the semiconductor pattern. A first insulating layer INS1 may be located on the semiconductor pattern. A gate G of the transistor TR may be located on the first insulating layer INS1. A second insulating layer INS2 may be located on the gate G. A third insulating layer INS3 may be located on the second insulating layer INS2.

A connection electrode CNE may include a first connection electrode CNE1 and a second connection electrode CNE2 to connect the transistor TR and the light-emitting element OLED. The first connection electrode CNE1 may be located on the third insulating layer INS3, and may be connected to the drain D through a first contact hole CH1 defined in the first to third insulating layers INS1, INS2, and INS3.

A fourth insulating layer INS4 may be located on the first connection electrode CNE1. A fifth insulating layer INS5 may be located on the fourth insulating layer INS4. The second connection electrode CNE2 may be located on the fifth insulating layer INS5. The second connection electrode CNE2 may be connected to the first connection electrode CNE1 through a second contact hole CH2 defined in the fourth and fifth insulating layers INS4 and INS5.

A sixth insulating layer INS6 may be located on the second connection electrode CNE2. The layers from the buffer layer BFL to the sixth insulating layer INS6 may be defined as a circuit element layer DP-CL. The first insulating layer INS1 to the sixth insulating layer INS6 may be inorganic layers or organic layers.

The first electrode AE may be located on the sixth insulating layer INS6. The first electrode AE may be connected to the second connection electrode CNE2 through a third contact hole CH3 defined in the sixth insulating layer INS6. A pixel-defining film PDL having an opening PX_OP defined therein for exposing a portion (e.g., predetermined portion) of the first electrode AE may be located on the first electrode AE and the sixth insulating layer INS6.

The hole control layer HCL may be located on the first electrode AE and the pixel-defining film PDL. The hole control layer HCL may include a hole transport layer and a hole injection layer.

The light-emitting layer EML may be located on the hole control layer HCL. The light-emitting layer EML may be located in a region corresponding to the opening PX_OP. The light-emitting layer EML may include an organic and/or inorganic material. The light-emitting layer EML may generate any one among red light, green light, and blue light.

The electron control layer ECL may be located on the light-emitting layer EML and the hole control layer HCL. The electron control layer ECL may include an electron transport layer and an electron injection layer. The hole control layer HCL and the electron control layer ECL may be located in common in the light-emitting region PA and the non-light-emitting region NPA.

The second electrode CE may be located on the electron control layer ECL. The second electrode CE may be located in common in the pixels PX. A layer in which the light-emitting element OLED is located may be defined as a display element layer DP-OLED.

A thin-film encapsulation layer TFE may be located on the second electrode CE to cover the pixel PX. The thin-film encapsulation layer TFE may include a first encapsulation layer EN1 located on the second electrode CE, a second encapsulation layer EN2 located on the first encapsulation layer EN1, and a third encapsulation layer EN3 located on the second encapsulation layer EN2.

The first and third encapsulation layers EN1 and EN3 may include an inorganic insulating layer, and may protect the pixel PX from moisture/oxygen. The second encapsulation layer EN2 may include an organic insulating layer, and may protect the pixel PX from foreign substances, such as dust particles.

A first voltage may be applied to the first electrode AE through the transistor TR, and a second voltage having a lower level than the first voltage may be applied to the second electrode CE. A hole and an electron injected into the light-emitting layer EML may combine to form an exciton, and as the exciton transitions to a ground state, the light-emitting element OLED may emit light.

An input-sensing part ISP may be located on the thin-film encapsulation layer TFE. The input-sensing part ISP may be manufactured directly on an upper surface of the thin-film encapsulation layer TFE.

A base layer BS may be located on the thin-film encapsulation layer TFE. The base layer BS may include an inorganic insulating layer. At least one inorganic insulating layer may be provided as the base layer BS on the thin-film encapsulation layer TFE.

The input-sensing part ISP may include a first conductive pattern CTL1 and a second conductive pattern CTL2 located on the first conductive pattern CTL1. The first conductive pattern CTL1 may be located on the base layer BS. An insulating layer TINS may be located on the base layer BS to cover the first conductive pattern CTL1. The insulating layer TINS may include an inorganic insulating layer or an organic insulating layer. The second conductive pattern CTL2 may be located on the insulating layer TINS.

The first and second conductive patterns CTL1 and CTL2 may overlap the non-light-emitting region NPA. In one or more embodiments, the first and second conductive patterns CTL1 and CTL2 may be located on the non-light-emitting region NPA between light-emitting regions PA, and may have a mesh shape.

The first and second conductive patterns CTL1 and CTL2 may form sensors of the input-sensing part ISP described above. For example, the first and second conductive patterns CTL1 and CTL2 having a mesh shape may be separated from each other in a region (e.g., predetermined region), and may form the sensors. A portion of the second conductive pattern CTL2 may be connected to the first conductive pattern CTL1.

An anti-reflective layer RPL may be located on the second conductive pattern CTL2. The anti-reflective layer RPL may include a black matrix BM and a plurality of color filters CF. The black matrix BM may overlap the non-light-emitting region NPA, and the color filters CF may respectively overlap light-emitting regions PA.

The black matrix BM may be located on the insulating layer TINS to cover the second conductive pattern CTL2. An opening B_OP overlapping the light-emitting region PA and the opening PX_OP may be defined in the black matrix BM. The black matrix BM may absorb and block light. A width of the opening B_OP may be greater than a width of the opening PX_OP.

The color filters CF may be located on the insulating layer TINS and the black matrix BM. The color filters CF may be respectively located in openings B_OP. A planarization insulating layer PINS may be located on the color filters CF. The planarization insulating layer PINS may provide a flat upper surface.

When external light travelling toward a display panel DP is reflected from the display panel DP and is provided back to an external user, like a mirror, the user may visually recognize the external light. To reduce or prevent the likelihood of such a phenomenon, by way of example, the anti-reflective layer RPL may include a plurality of color filters CF that display the same color as that of the pixels PX of the display panel DP. The color filters CF may filter external light to the same color as that of the pixels PX. In such a case, the external light may not be visually recognized by a user.

However, the present disclosure is not limited thereto, and the anti-reflective layer RPL may include a polarization film to reduce reflectance for external light. The polarization film may be separately manufactured and attached onto the input-sensing part ISP through an adhesive layer. The polarization film may include a retarder and/or a polarizer.

Figure 9:
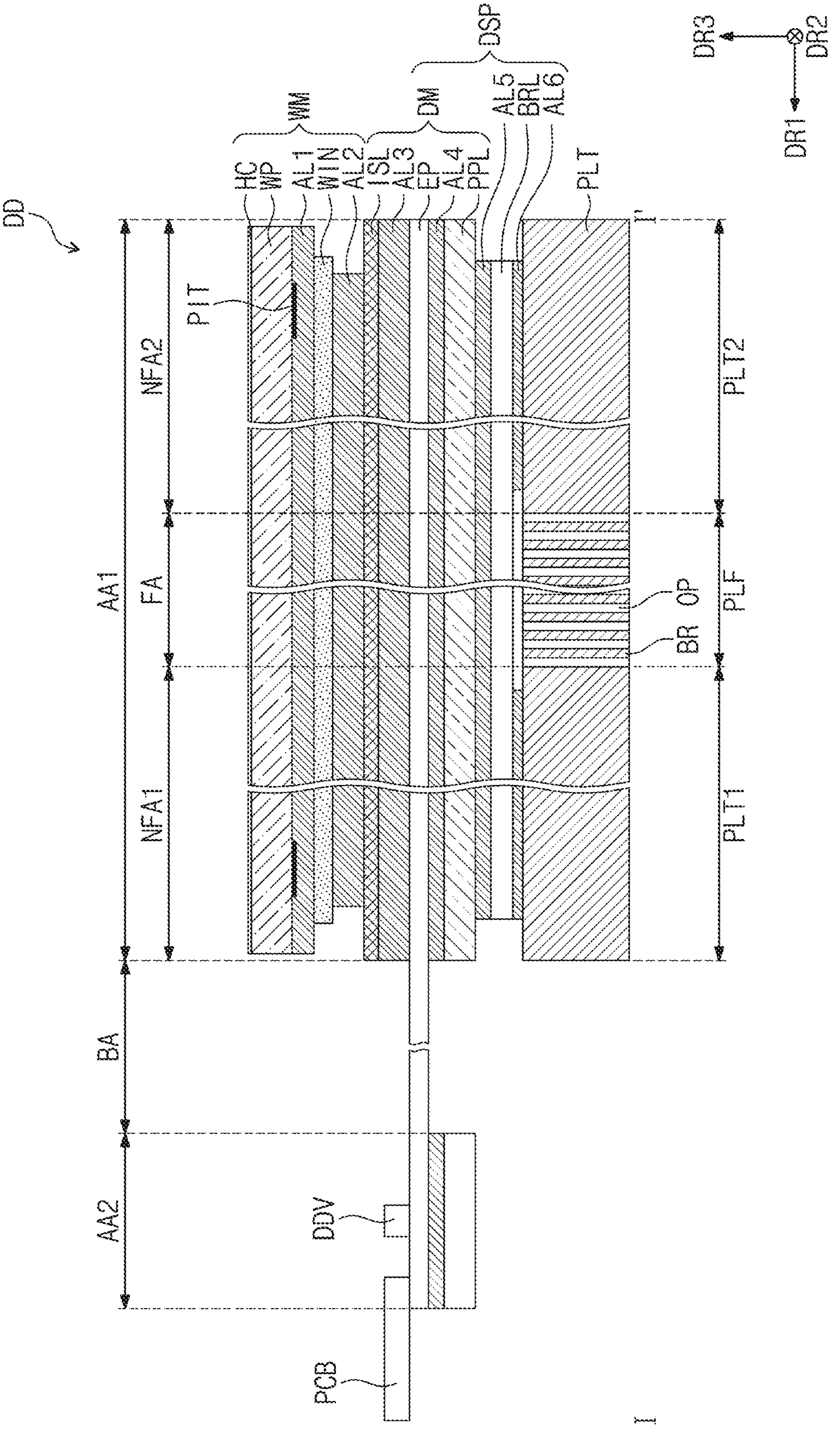
FIG. 9 is a cross-sectional view taken along the line I-I' in FIG. 7.
Figure 10:
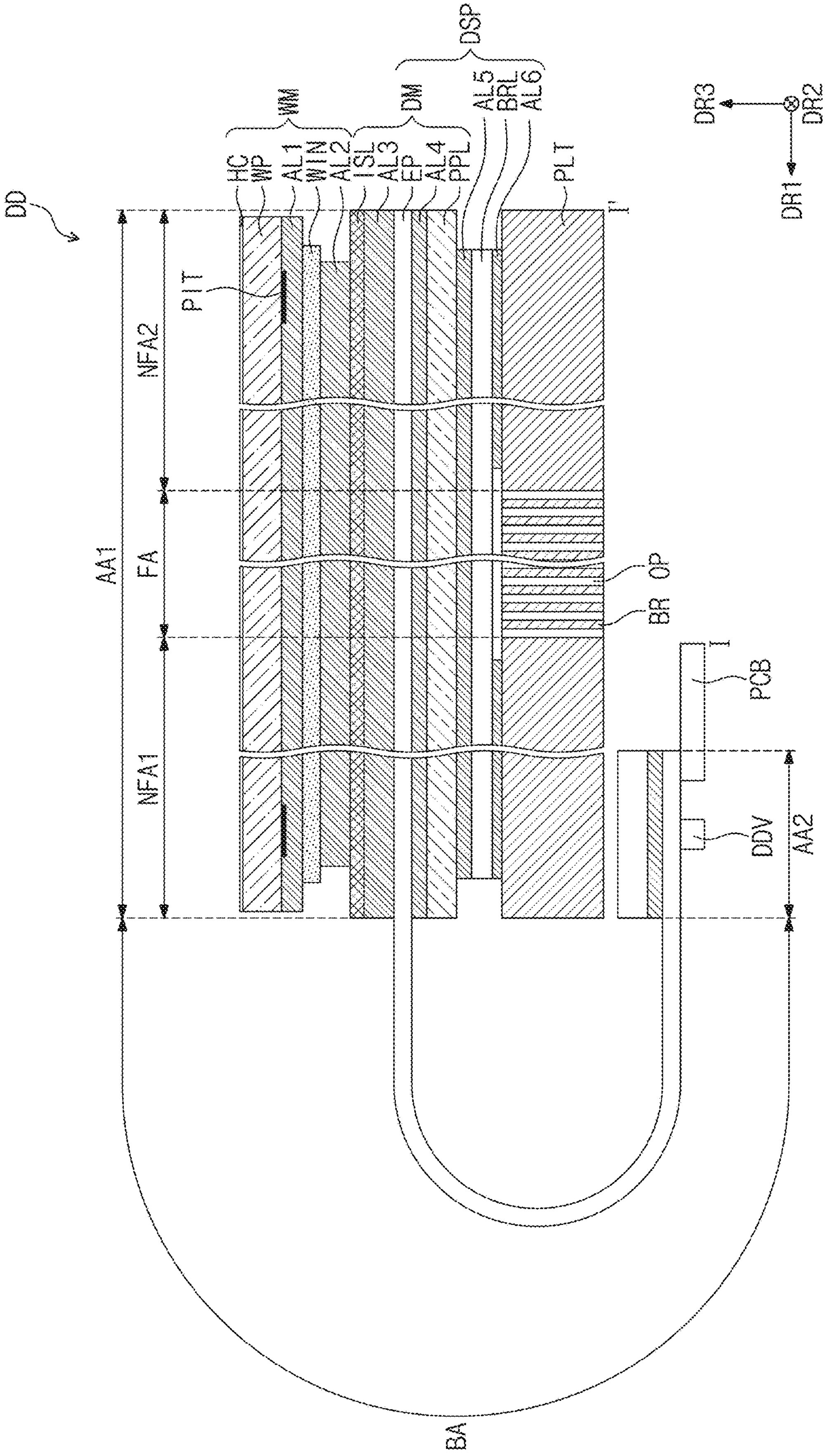
FIG. 10 illustrates that a bending region in FIG. 9 is bent.

FIG. 9 is a cross-sectional view taken along the line I-I' in FIG. 7. FIG. 10 illustrates that a bending region in FIG. 9 is bent. FIG. 9 illustrates a portion of a display part DSP, a portion of a supporting plate PLT, and a portion of a window module WM.

Referring to FIG. 9, a display device DD may include the display part DSP, the window module WM located on the display part DSP, and the supporting plate PLT located under the display part DSP. The supporting plate PLT may support a display module DM. The window module WM may include a window WIN, a window protective layer WP, a hard coating layer HC, and first and second adhesive layers AL1 and AL2.

The display part DSP may include an electronic panel EP, an impact-absorbing layer ISL, a panel protective layer PPL, a barrier layer BRL, and third to sixth adhesive layers AL3, AL4, AL5, and AL6. The impact-absorbing layer ISL, the electronic panel EP, the panel protective layer PPL, the third adhesive layer AL3, and the fourth adhesive layer AL4 may be defined as the display module DM. Because the configurations of the electronic panel EP and the panel protective layer PPL are described above in detail with reference to FIG. 5, description thereof is omitted.

The impact-absorbing layer ISL may be located on the electronic panel EP. The impact-absorbing layer ISL may absorb external impact applied toward the electronic panel EP from above the display device DD, thereby protecting the electronic panel EP. The impact-absorbing layer ISL may be manufactured in a form of a stretchable film.

The impact-absorbing layer ISL may include a flexible plastic material. The flexible plastic material may be defined as a synthetic resin film. For example, the impact-absorbing layer ISL may include a flexible plastic material, such as polyimide (PI) or polyethylene terephthalate (PET).

The window WIN may be located on the impact-absorbing layer ISL. The window WIN may protect the electronic panel EP from an external scratch. The window WIN may have an optically transparent property. The window WIN may include glass. However, the present disclosure is not limited thereto, and the window WIN may include a synthetic resin film.

The window WIN may have a multi-layered or single-layered structure. For example, the window WIN may include a plurality of synthetic resin films, which are coupled to each other through an adhesive agent, or may include a glass substrate and a synthetic resin film, which are coupled to each other through an adhesive agent.

The window protective layer WP may be located on the window WIN. The window protective layer WP may include a flexible plastic material, such as polyimide or polyethylene terephthalate. The hard coating layer HC may be located on an upper surface of the window protective layer WP.

A printed layer PIT may be located on a lower surface of the window protective layer WP. The printed layer PIT may have a black color, but a color of the printed layer PIT is not limited thereto. The printed layer PIT may be adjacent to an edge of the window protective layer WP.

The barrier layer BRL may be located below the panel protective layer PPL. The barrier layer BRL may increase resistance to compressive force due to external pressing. Accordingly, the barrier layer BRL may reduce or prevent the likelihood of deformation of the electronic panel EP. The barrier layer BRL may include a flexible plastic material, such as polyimide or polyethylene terephthalate.

The barrier layer BRL may have a color that absorbs light. For example, the barrier layer BRL may have a black color. In such a case, when the display module DM is viewed from above the display module DM, components located under the barrier layer BRL may not be visually recognized.

The first adhesive layer AL1 may be located between the window protective layer WP and the window WIN. The window protective layer WP and the window WIN may be coupled to each other through the first adhesive layer AL1. The first adhesive layer AL1 may cover the printed layer PIT.

The second adhesive layer AL2 may be located between the window WIN and the impact-absorbing layer ISL. The window WIN and the impact-absorbing layer ISL may be coupled to each other through the second adhesive layer AL2.

The third adhesive layer AL3 may be located between the impact-absorbing layer ISL and the electronic panel EP. The impact-absorbing layer ISL and the electronic panel EP may be coupled to each other through the third adhesive layer AL3.

The fourth adhesive layer AL4 may be located between the electronic panel EP and the panel protective layer PPL. The electronic panel EP and the panel protective layer PPL may be coupled to each other through the fourth adhesive layer AL4.

The fifth adhesive layer AL5 may be located between the panel protective layer PPL and the barrier layer BRL. The panel protective layer PPL and the barrier layer BRL may be coupled to each other through the fifth adhesive layer AL5.

The sixth adhesive layer AL6 may be located between the barrier layer BRL and the supporting plate PLT. For example, the supporting plate PLT may be located below the barrier layer BRL, and the sixth adhesive layer AL6 may be located between the barrier layer BRL and the supporting plate PLT. The barrier layer BRL and the supporting plate PLT may be coupled to each other through the sixth adhesive layer AL6.

The sixth adhesive layer AL6 may overlap the first and second non-folding regions NFA1 and NFA2, and may not overlap the folding region FA. That is, the sixth adhesive layer AL6 may be omitted from the folding region FA.

The first to sixth adhesive layers AL1, AL2, AL3, AL4, AL5, and AL6 may include a pressure sensitive adhesive (PSA) or a transparent adhesive, such as an optically clear adhesive, but a type of an adhesive are not limited thereto.

A thickness of the panel protective layer PPL may be less than a thickness of the window protective layer WP, and a thickness of the barrier layer BRL may be less than the thickness of the panel protective layer PPL. A thickness of the electronic panel EP may be less than the thickness of the barrier layer BRL, and may be about the same as a thickness of the window WIN. A thickness of the impact-absorbing layer ISL may be less than the thickness of the electronic panel EP.

A thickness of the first adhesive layer AL1 may be about the same as the thickness of the barrier layer BRL, and a thickness of each of the second adhesive layer AL2 and the third adhesive layer AL3 may be about the same as the thickness of the panel protective layer PPL. A thickness of the fourth adhesive layer AL4 may be about the same as a thickness of the fifth adhesive layer AL5.

The thickness of each of the fourth adhesive layer AL4 and the fifth adhesive layer AL5 may be less than the thickness of the electronic panel EP, and may be greater than the thickness of the impact-absorbing layer ISL. A thickness of the sixth adhesive layer AL6 may be less than the thickness of the impact-absorbing layer ISL. A thickness of the hard coating layer HC may be less than the thickness of the sixth adhesive layer AL6.

The electronic panel EP, the impact-absorbing layer ISL, the panel protective layer PPL, and the third and fourth adhesive layers AL3 and AL4 may have roughly the same width. The window protective layer WP and the first adhesive layer AL1 may have roughly the same width. The barrier layer BRL and the fifth and sixth adhesive layers AL5 and AL6 may have roughly the same width.

The widths of the electronic panel EP, the impact-absorbing layer ISL, the panel protective layer PPL, and the third and fourth adhesive layers AL3 and AL4 may be greater than the widths of the window protective layer WP and the first adhesive layer AL1. Edges of the electronic panel EP, the impact-absorbing layer ISL, the panel protective layer PPL, and the third and fourth adhesive layers AL3 and AL4 may be outside edges of the window protective layer WP and the first adhesive layer AL1.

The widths of the window WIN and the second adhesive layer AL2 may be less than the widths of the window protective layer WP and the first adhesive layer AL1. The width of the second adhesive layer AL2 may be less than the width of the window WIN. An edge of the window WIN may be located inside edges of the window protective layer WP and the first adhesive layer AL1. An edge of the second adhesive layer AL2 may be located inside the edge of the window WIN.

The widths of the barrier layer BRL and the fifth and sixth adhesive layers AL5 and AL6 may be less than the widths of the window protective layer WP and the first adhesive layer AL1. Edges of the barrier layer BRL and the fifth and sixth adhesive layers AL5 and AL6 may be located inside the edges of the window protective layer WP and the first adhesive layer AL1.

The supporting plate PLT may be located under the display part DSP to support the display part DSP. The supporting plate PLT may be located below the electronic panel EP to support the electronic panel EP. A width of the supporting plate PLT may be substantially the same as the width of the electronic panel EP. The supporting plate PLT may have greater rigidity than the display part DSP.

The supporting plate PLT may include a non-metal material. For example, the supporting plate PLT may include a fiber reinforced composite. The fiber reinforced composite may be carbon fiber reinforced plastic (CFRP) or glass fiber reinforced plastic (GFRP).

The supporting plate PLT may include a fiber reinforced composite to be relatively lightweight. By including the fiber reinforced composite, the supporting plate PLT according to one or more embodiments may be lighter than a metal supporting plate including a metal material, and may have a modulus and strength similar to those of the metal supporting plate.

In addition, by including a fiber reinforced composite, the supporting plate PLT may be easily shaped compared to the metal supporting plate. For example, the supporting plate PLT including a fiber reinforced composite may be more easily processed through a laser process or a micro-blast process. However, this is only an example, and the present disclosure is not limited thereto, and the supporting plate PLT may include a metal material.

The supporting plate PLT may include a first non-folding part PLT1, a folding part PLF, and a second non-folding part PLT2. The first non-folding part PLT1 may overlap the first non-folding region NFA1. The folding part PLF may overlap the folding region FA. The second non-folding part PLT2 may overlap the second non-folding region NFA2.

A plurality of openings OP may be defined in the folding part PLF. The openings OP may be formed by passing through portions of the supporting plate PLT in a third direction DR3. When viewed in a second direction DR2, the openings OP may be arranged to be spaced apart from each other in a first direction DR1. The openings OP may be formed through the laser process or the micro-blast process mentioned above. A width of a portion in which the openings OP are formed may be less than a width of an open portion of the sixth adhesive layer AL6.

The openings OP may be defined in a portion of the supporting plate PLT overlapping the folding region FA, thereby increasing flexibility of the portion of the supporting plate PLT overlapping the folding region FA. As a result, the supporting plate PLT may be folded with respect to the folding region FA.

The folding part PLF may include branch parts BR. The branch parts BR may be located between, or may define, the openings OP adjacent to each other in the first direction DR1. More detailed shapes of the openings OP and the branch parts BR will be described in detail with reference to FIG. 12.

In one or more embodiments, the display device DD may further include a digitizer, a shielding layer, and a heat dissipation layer, which are located under the supporting plate PLT.

Referring to FIG. 10, the panel protective layer PPL and the fourth adhesive layer AL4 may not be located below a bending region BA. The panel protective layer PPL and the fourth adhesive layer AL4 may be located below a second region AA2 of the electronic panel EP. The data driver DDV may be located below the second region AA2 of the electronic panel EP.

A printed circuit board PCB may be connected to the second region AA2 of the electronic panel EP. The printed circuit board PCB may be connected to one side of the second region AA2. As the bending region BA is bent, the second region AA2 may be located below a first region AA1. Accordingly, the data driver DDV and the printed circuit board PCB may be located below the first region AA1.

Figure 11:
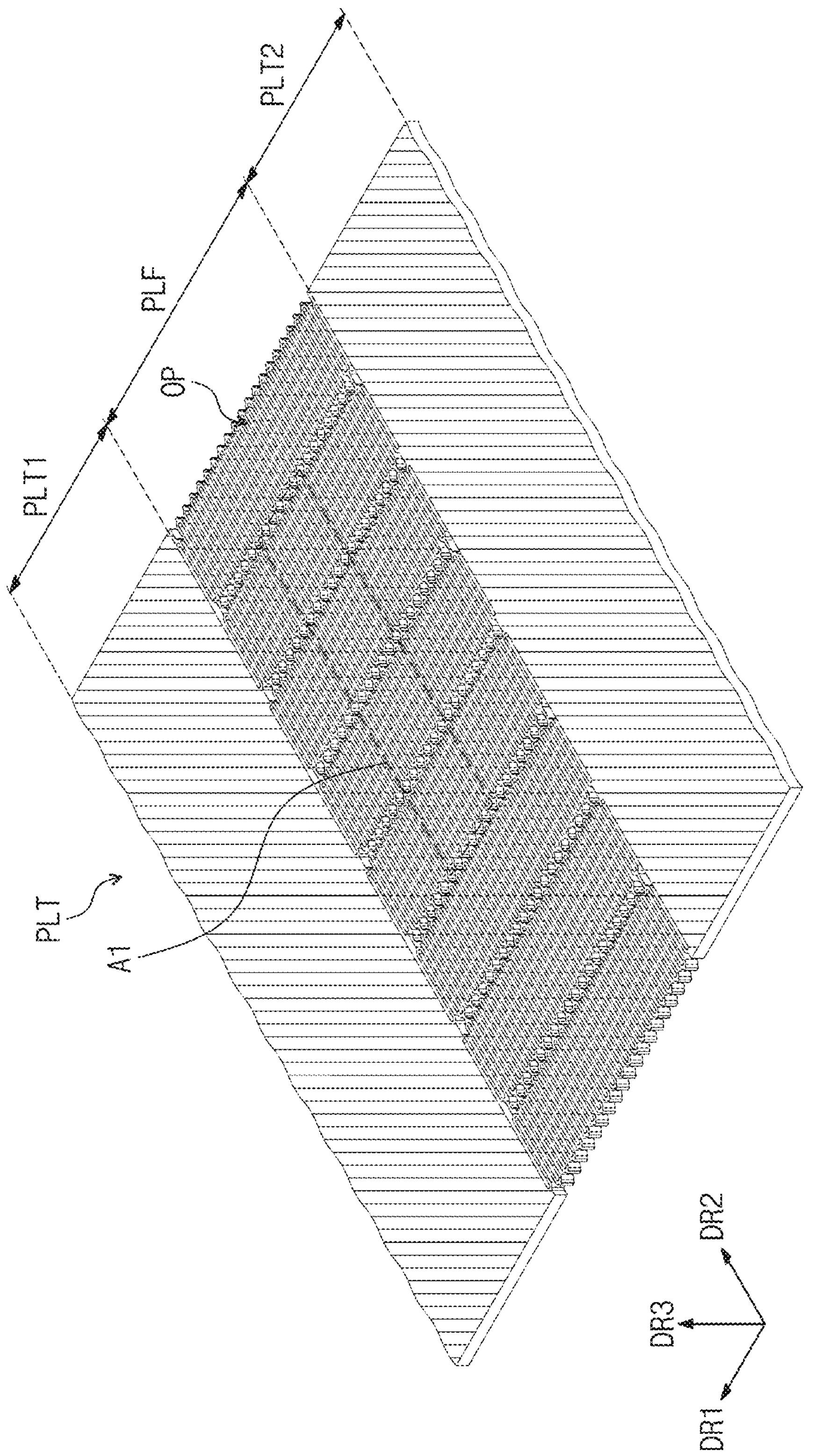
FIG. 11 is a perspective view of a supporting plate in FIG. 9.
Figure 12:
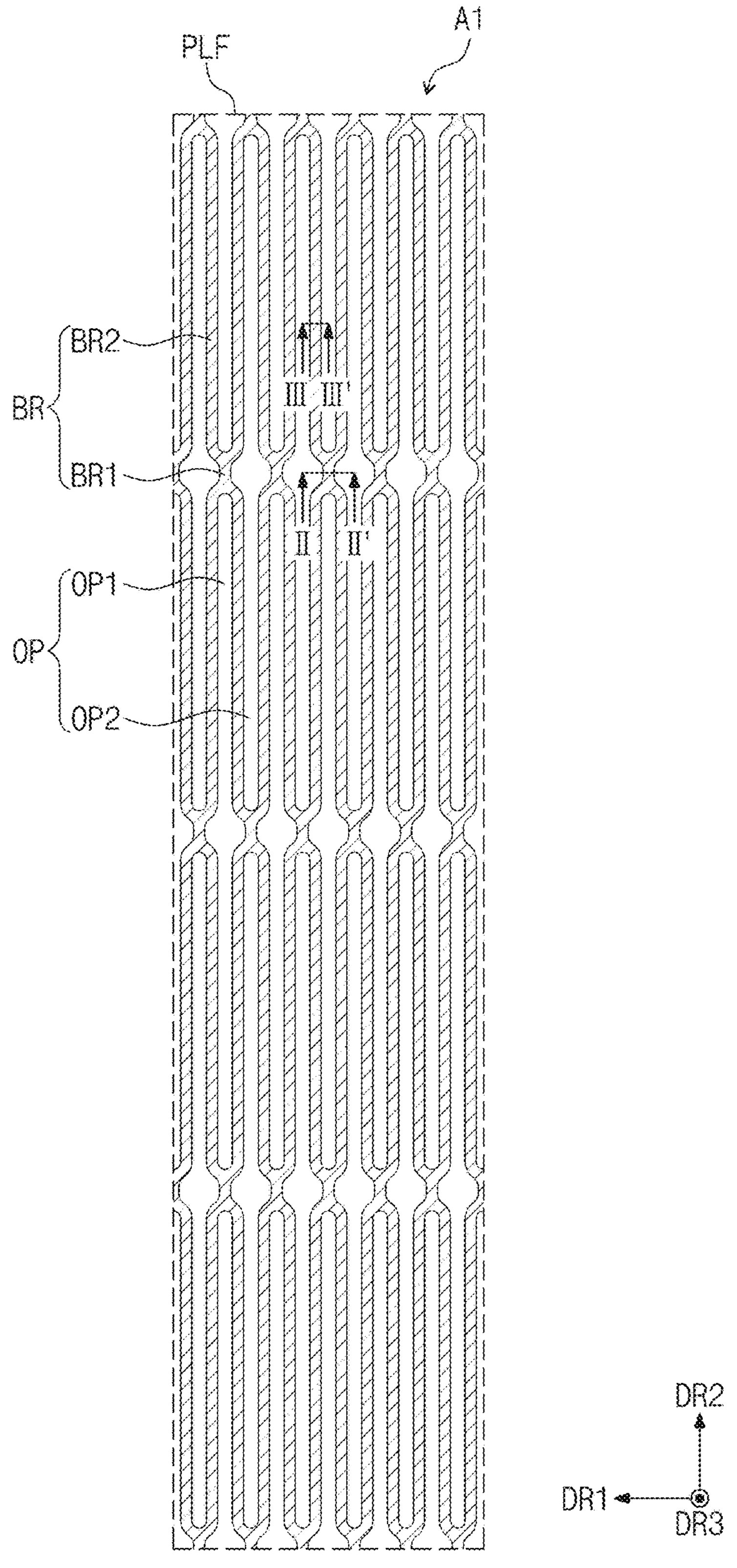
FIG. 12 is an enlarged view of a folding part in FIG. 11.
Figure 13A:
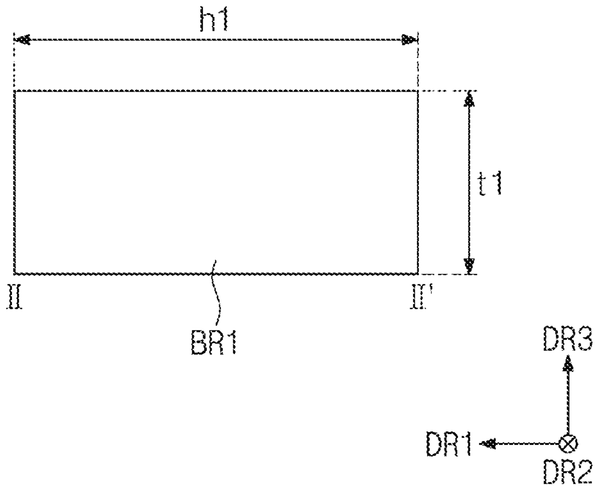
FIG. 13A is a cross-sectional view taken along the line II-II' in FIG. 12.
Figure 13B:
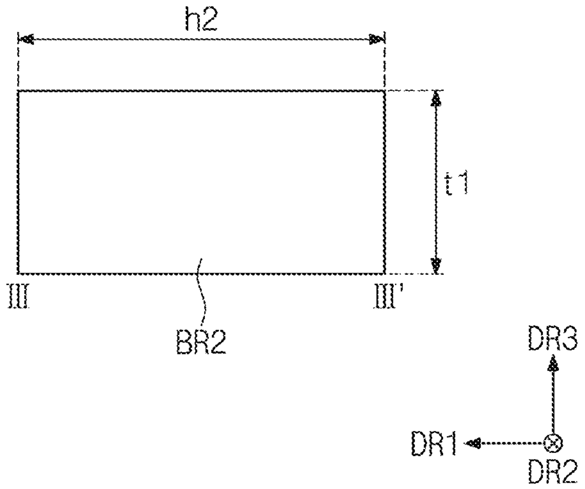
FIG. 13B is a cross-sectional view taken along the line III-III' in FIG. 12.

FIG. 11 is a perspective view of the supporting plate in FIG. 9. FIG. 12 is an enlarged view of a folding part in FIG. 11. FIG. 13A is a cross-sectional view taken along the line II-II' in FIG. 12. FIG. 13B is a cross-sectional view taken along the line III-III' in FIG. 12. FIG. 12 is an enlarged plan view of a first region A1 in FIG. 11. FIG. 13A is a cross-sectional view of a first branch part BR1 in FIG. 12. FIG. 13B is a cross-sectional view of a second branch part BR2 in FIG. 12.

Referring to FIG. 11, in a plan view, the supporting plate PLT may have a rectangular shape having short sides extending in a first direction DR1 and long sides extending in a second direction DR2. However, this is only an example, and the supporting plate PLT may have various shapes.

The supporting plate PLT may include the first non-folding part PLT1, the folding part PLF, and the second non-folding part PLT2. The folding part PLF may be located between the first non-folding part PLT1 and the second non-folding part PLT2. The first non-folding part PLT1, the folding part PLF, and the second non-folding part PLT2 may be arranged in the first direction DR1. The first non-folding part PLT1 and the second non-folding part PLT2 may respectively overlap the first non-folding region NFA1 and the second non-folding region NFA2 in FIGS. 7 and 9. The folding part PLF may overlap the folding region FA in FIGS. 7 and 9.

The first non-folding part PLT1 and the second non-folding part PLT2 may each have a quadrangular shape that is parallel to a plane that is defined by the first direction DR1 and the second direction DR2. However, the present disclosure is not limited thereto, and the first and second non-folding parts PLT1 and PLT2 may have various shapes.

A lattice pattern may be defined in the folding part PLF. For example, the plurality of openings OP may be defined in/by the folding part PLF. The openings OP may be arranged according to a rule (e.g., predetermined rule). The openings OP may be arranged in a lattice shape to form the lattice pattern in the folding part PLF.

Referring to FIG. 12, the openings OP may be arranged in a first direction DR1 and in a second direction DR2. In a plan view, the openings OP adjacent to each other in the first direction DR1 may be located in a staggered manner. The openings OP may extend further in the second direction DR2 than in the first direction DR1.

The openings OP may include a plurality of first openings OP1 arranged in the second direction DR2, and a plurality of second openings OP2 arranged in the second direction DR2 and adjacent to the first openings OP1 in the first direction DR1. The first openings OP1 and the second openings OP2 may be located in a staggered manner.

The folding part PLF may include branch parts BR. The folding part PLF may include first branch parts BR1 located between the openings OP adjacent to each other in the second direction DR2, and second branch parts BR2 located between the openings OP adjacent to each other in the first direction DR1. The first branch parts BR1 may extend in the first direction DR1, and the second branch parts BR2 may extend in the second direction DR2. The first branch parts BR1 may connect the second branch parts BR2 adjacent to each other in the first direction DR1. The openings OP may be defined by the first and second branch parts BR1 and BR2. In a plan view, the openings OP may have a shape corresponding to the first and second branch parts BR1 and BR2.

Referring to FIGS. 12 and 13A, in a plan view, a width of each of the first branch parts BR1 in the first direction DR1 may be variable. For example, the width of each of the first branch parts BR1 in the first direction DR1 may become smaller toward a center of each of the first branch parts BR1. At the center of each of the first branch parts BR1, the width of each of the first branch parts BR1 in the first direction DR1 may be the smallest. Two sides of each of the first branch parts BR1 opposed to each other in the first direction DR1 may have a concave shape. The centers of the first branch parts BR1 may be defined as centers of the openings OP adjacent to each other in the second direction DR2.

The width of each of the first branch parts BR1 in the first direction DR1 may be variable, and an area of a cross section of each of the first branch parts BR1 may thus be variable. For example, a first thickness t1 defined as a thickness of each of the first branch parts BR1 may be constant. A first width h1 of each of the first branch parts BR1 in the first direction DR1 may be variable. The first width h1 may become smaller toward the center of each of the first branch parts BR1. Accordingly, the area of the cross section of each of the first branch parts BR1 may become smaller toward the center of each of the first branch parts BR1.

Rigidity of the first branch parts BR1 may be proportional to the first width h1 and the first thickness t1. As the area of the cross section of each of the first branch parts BR1 is smaller, the rigidity of the first branch parts BR1 may become less. The area of the cross section of each of the first branch parts BR1 may be the smallest at the center of each of the first branch parts BR1. The rigidity of the first branch parts BR1 will be described later.

The openings OP defined between the first branch parts BR1 may have a shape corresponding to two sides of each of the first branch parts BR1 opposed to each other in the first direction DR1. For example, the openings OP may have a shape that is convex along side surfaces of the first branch parts BR1.

Referring to FIGS. 12 and 13B, in a plan view, a length of each of the second branch parts BR2 in the first direction DR1 may be constant. A second width h2 defined as a width of each of the second branch parts BR2 in the first direction DR1 may be constant. A thickness of each of the second branch parts BR2 may be a first thickness t1. The thickness of each of the second branch parts BR2 may be about the same as the thickness of each of the first branch parts BR1.

Figure 14A:
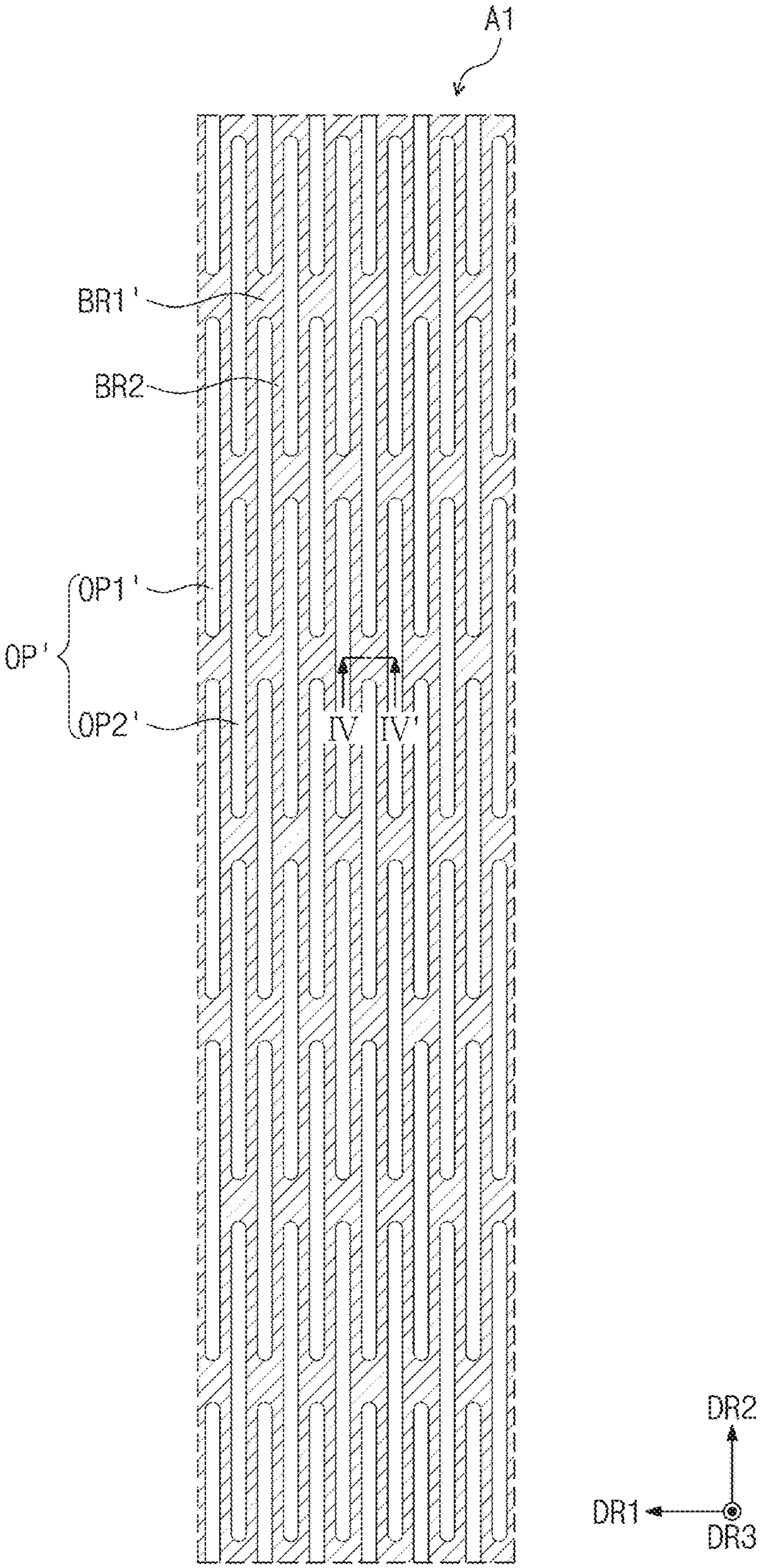
FIGS. 14A to 14C are views illustrating a folding part according to a Comparative Example.
Figure 14B:
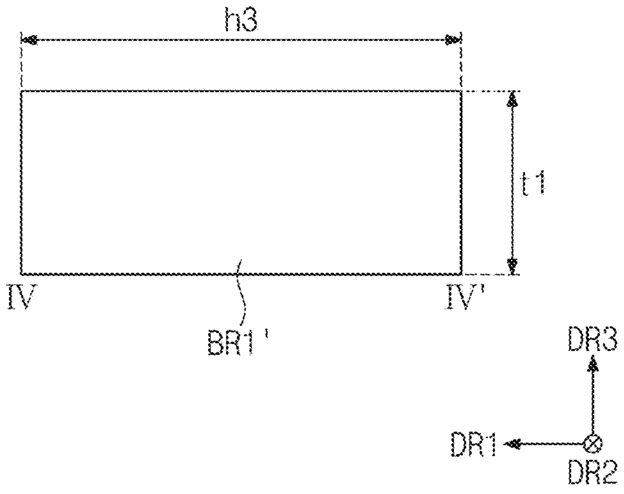
Figure 14C:
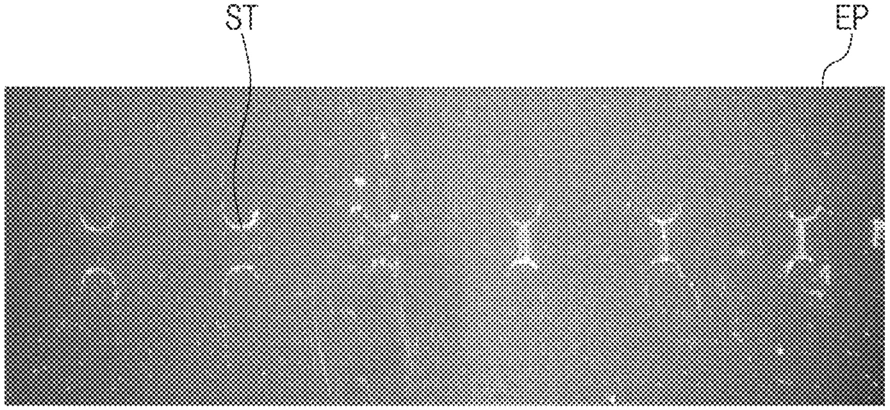

FIGS. 14A to 14C are views illustrating a folding part according to a Comparative Example. FIG. 14A is an enlarged plan view corresponding to a first region A1 in FIG. 11. FIG. 14B is a cross-sectional view taken along the line IV-IV' in FIG. 14A. FIG. 14C is a rear surface of the electronic panel EP in FIG. 9.

Referring to FIGS. 14A and 14B, a width of each of first branch parts BR1' in a first direction DR1 may be constant. Widths of portions of the first branch parts BR1' adjacent to edges of openings OP' may be about the same as widths of centers of the first branch parts BR1'. As illustrated in FIG. 14B, a third width h3 defined as the width of each of the first branch parts BR1' in the first direction DR1 may be constant. A thickness of each of the first branch parts BR1' may be a first thickness t1.

Referring to FIGS. 1, 13B, 14B, and 14C, the third width h3 may be greater than the second width h2. An area of a cross section of each of the first branch parts BR1' may be greater than an area of a cross section of each of second branch parts BR2.

When a folding region FA of a display device DD is folded, the first branch parts BR1' and the second branch parts BR2 may be deformed. The amount of possible deformation of the first branch parts BR1' and the second branch parts BR2 may be inversely proportional to rigidity of the first branch parts BR1' and the second branch parts BR2. The rigidity of the first branch parts BR1' and the second branch parts BR2 may be proportional to widths in the first direction DR1 and thicknesses of the first branch parts BR1' and the second branch parts BR2. That is, the amount of possible deformation of the first branch parts BR1' and the second branch parts BR2 may be inversely proportional to the widths in the first direction DR1 and the thicknesses of the first branch parts BR1' and the second branch parts BR2.

The width of each of the first branch parts BR1' in the first direction DR1 may be greater than the width of each of the second branch parts BR2 in the first direction DR1, and the area of the cross-section of each of the first branch parts BR1' may thus be greater than the area of the cross-section of each of the second branch parts BR2. Accordingly, the rigidity of the first branch parts BR1' may be greater than the rigidity of the second branch parts BR2. The amount of possible deformation of the second branch parts BR2 may be greater than the amount of possible deformation of the first branch parts BR1'.

When the display device DD is folded, the first branch parts BR1' and the second branch parts BR2 located below the electronic panel EP (see FIG. 9) may apply pressure to a rear surface of the electronic panel EP (see FIG. 9). The amount of pressure applied to the rear surface of the electronic panel EP (see FIG. 9) may be inversely proportional to the amount of possible deformation of the first and second branch parts BR1' and BR2. The pressure applied to the rear surface of the electronic panel EP (see FIG. 9) may be concentrated at the branch parts BR1' and BR2 having relatively great rigidity. Accordingly, the first branch parts BR1' may apply greater pressure to the rear surface of the electronic panel EP (see FIG. 9) than the second branch parts BR2.

By the pressure that the first branch parts BR1' apply to the rear surface of the electronic panel EP (see FIG. 9), a residue that remains on an upper surface of a supporting plate PLT (see FIG. 9) in a process may stick to the rear surface of the electronic panel EP (see FIG. 9). The residue may leave stains ST on the rear surface of the electronic panel EP (see FIG. 9). The stains ST left on the rear surface of the electronic panel EP (see FIG. 9) may be visible to a user from outside the display device DD, and a defect of the display device DD may thus occur.

Referring to FIGS. 1, 13A, and 13B, the first width h1 of each of the first branch parts BR1 in the first direction DR1 may be variable. The first width h1 of each of the first branch parts BR1 may become smaller toward the center of each of the first branch parts BR1. Accordingly, the area of the cross section of each of the first branch parts BR1 may become smaller toward the center of each of the first branch parts BR1.

The rigidity of the first branch parts BR1 may be less than the rigidity of the first branch parts BR1' (see FIG. 14B) according to the Comparative Example. The amount of possible deformation of the first branch parts BR1 may be greater than the amount of possible deformation of the first branch parts BR1' (see FIG. 14B) according to the Comparative Example.

A difference in area between the cross section of each of the first branch parts BR1 and a cross section of each of the second branch parts BR2 may be less than a difference in area between the cross section of each of the first branch parts BR1' (see FIG. 14B) and the cross section of each of the second branch parts BR2. Accordingly, a difference in the amount of possible deformation between the first branch parts BR1 and the second branch parts BR2 may be less than a difference in the amount of possible deformation between the first branch parts BR1' and the second branch parts BR2 according to the Comparative Example.

The difference in the amount of possible deformation between the first branch parts BR1 and the second branch parts BR2 may be reduced, and a difference between pressure applied to a rear surface of the electronic panel EP (see FIG. 9) by the first branch parts BR1 and the second branch parts BR2 may thus be reduced. When the display device DD is folded, pressure applied to the display panel DP (see FIG. 9) by the first branch parts BR1 and the second branch parts BR2 may be dispersed. Accordingly, a residue which remains on an upper surface of the supporting plate PLT (see FIG. 9) may not stick to the rear surface of the display panel DP (see FIG. 9). Thus, stains ST (see FIG. 14C) may not remain on the rear surface of the display panel DP (see FIG. 9), thereby reducing or preventing the likelihood of a defect of the stains ST (see FIG. 14C) being visible from outside the display device DD.

Figure 15A:
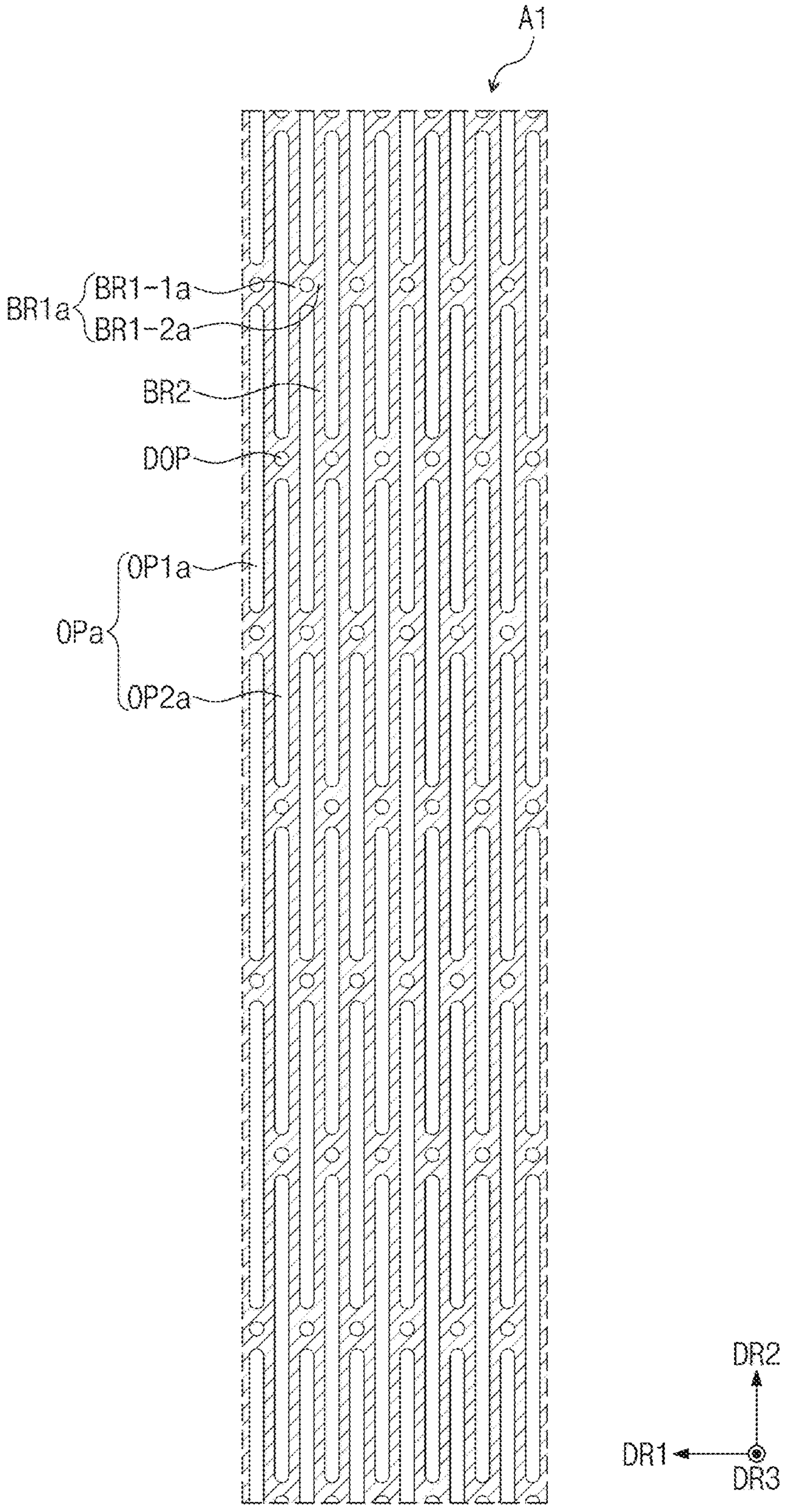
FIGS. 15A and 15B are views illustrating first branch parts according to other embodiments.
Figure 15B:
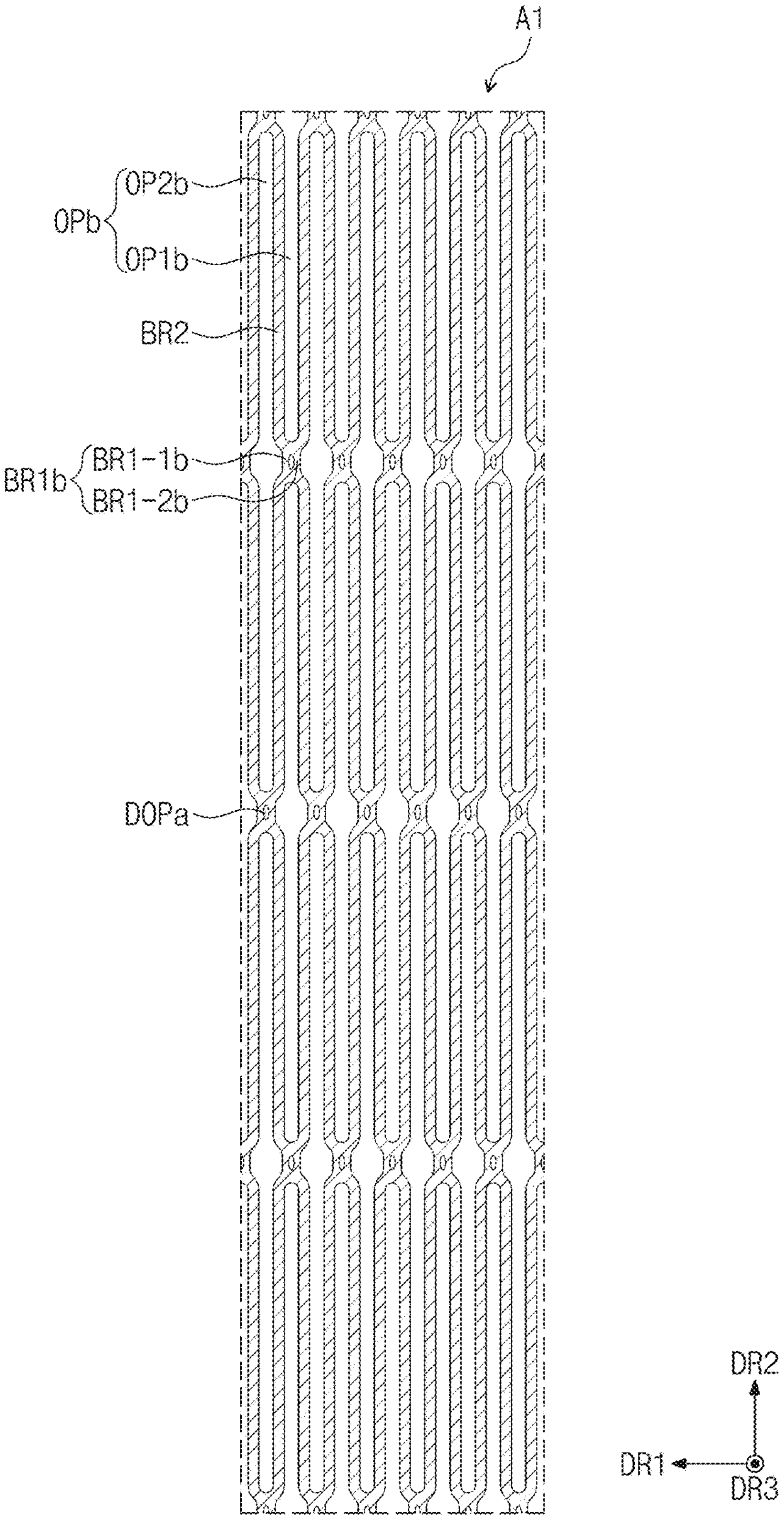

FIGS. 15A and 15B are views illustrating first branch parts according to other embodiments. FIGS. 15A and 15B are plan views.

Because second branch parts BR2 in FIGS. 15A and 15B are the same as the second branch parts BR2 in FIG. 12, description thereof will be omitted or made briefly.

Because openings OPa and OPb in FIGS. 15A and 15B are substantially the same as the openings OP in FIG. 12, except for shapes thereof, repeated description thereof will be omitted.

Referring to FIG. 15A, dummy openings DOP may be defined in first branch parts BR1*a*. In a plan view, the dummy openings DOP may be defined in centers of the first branch parts BR1*a*. The dummy openings DOP may have a circular shape. However, this is an example, and a shape of the dummy openings DOP is not limited thereto.

One dummy opening DOP is defined in each of the first branch parts BR1*a*, but the number of the dummy openings DOP is not limited thereto.

The first branch parts BR1*a* may include first sub branch parts BR1-1*a* and second sub branch parts BR1-2*a*. The first sub branch parts BR1-1*a* and the second sub branch parts BR1-2*a* may be symmetrical to each other in a first direction DR1 with respect to the dummy openings DOP. The dummy openings DOP may be defined by the first sub branch parts BR1-1*a* and the second sub branch parts BR1-2*a*.

Widths of the first sub branch parts BR1-1*a* and the second sub branch parts BR1-2*a* in the first direction DR1 may become smaller toward centers of the dummy openings DOP. For example, one side of two sides of each of the first sub branch parts BR1-1*a* opposed to each other in the first direction DR1 may be parallel to a second direction DR2. One side of two sides of each of the second sub branch parts BR1-2*a* opposed to each other in the first direction DR1 may be parallel to the second direction DR2. The other side of each of the first sub branch parts BR1-1*a* may be concave. The other side of each of the second sub branch parts BR1-2*a* may be concave. The one sides of the first and second sub branch parts BR1-1*a* and BR1-2*a* may be defined as sides respectively opposed to the other sides of the first and second sub branch parts BR1-1*a* and BR1-2*a* facing each other.

In one or more embodiments, because the widths of the first sub branch parts BR1-1*a* and the second sub branch parts BR1-2*a* in the first direction DR1 may become smaller, areas of cross sections of the first sub branch parts BR1-1*a* and of the second sub branch parts BR1-2*a* may become smaller toward the centers of the dummy openings DOP.

Because the widths of the first sub branch parts BR1-1*a* and of the second sub branch parts BR1-2*a* in the first direction DR1 may become smaller toward the centers of the dummy openings DOP, rigidity of the first branch parts BR1*a* may be reduced. A difference in the amount of possible deformation between the first branch parts BR1*a* and the second branch parts BR2 may be reduced.

Accordingly, pressure applied to a rear surface of the display panel DP (see FIG. 9) by the first branch parts BR1*a* and the second branch parts BR2 may be dispersed. Thus, stains ST (FIG. 14C) may not remain on the rear surface of the display panel DP (see FIG. 9), thereby reducing or preventing the likelihood of a defect of an electronic device ED (see FIG. 1).

Referring to FIG. 15B, dummy openings DOPa may be defined in first branch parts BR1*b*. In a plan view, the dummy openings DOPa may be defined in centers of the first branch parts BR1*b*. The dummy openings DOPa may have an oval shape. However, this is an example, and a shape of the dummy openings DOPa is not limited thereto.

One dummy opening DOPa is defined in each of the first branch parts BR1*b*, but the number of the dummy openings DOPa is not limited thereto.

The first branch parts BR1*b* may include first sub branch parts BR1-1*b* and second sub branch parts BR1-2*b*. The first sub branch parts BR1-1*b* and the second sub branch parts BR1-2*b* may be symmetrical to each other in a first direction DR1 with respect to the dummy openings DOPa. The dummy openings DOPa may be defined by the first sub branch parts BR1-1*b* and the second sub branch parts BR1-2*b*.

Widths of the first sub branch parts BR1-1*b* and the second sub branch parts BR1-2*b* in the first direction DR1 may become smaller toward the centers of the first branch parts BR1*b*. The widths of the first sub branch parts BR1-1*b* and the second sub branch parts BR1-2*b* in the first direction DR1 may become smaller toward centers of the dummy openings DOPa. For example, two sides of each of the first sub branch parts BR1-1*b* opposed to each other in the first direction DR1 may have a concave shape. Two sides of each of the second sub branch parts BR1-2*b* opposed to each other in the first direction DR1 may have a concave shape.

Because the widths of the first sub branch parts BR1-1*b* and the second sub branch parts BR1-2*b* in the first direction DR1 may become smaller toward the centers of the dummy openings DOPa, a difference in the amount of possible deformation between the first branch parts BR1*b* and the second branch parts BR2 may be reduced when an electronic device ED (see FIG. 1) is folded. Accordingly, pressure applied to a rear surface of the display panel DP (see FIG. 9) by the first branch parts BR1*b* and the second branch parts BR2 may be dispersed. Thus, stains ST (FIG. 14C) may not occur on the rear surface of the display panel DP (see FIG. 9), thereby reducing or preventing the likelihood of a defect of the electronic device ED (see FIG. 1).

Figure 16A:
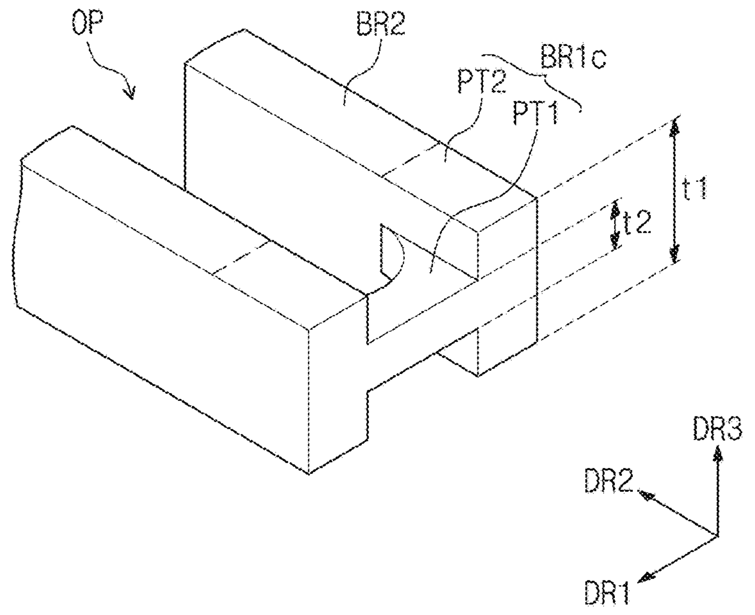
FIGS. 16A to 16C are views illustrating first branch parts according to other embodiments of the present disclosure.
Figure 16B:
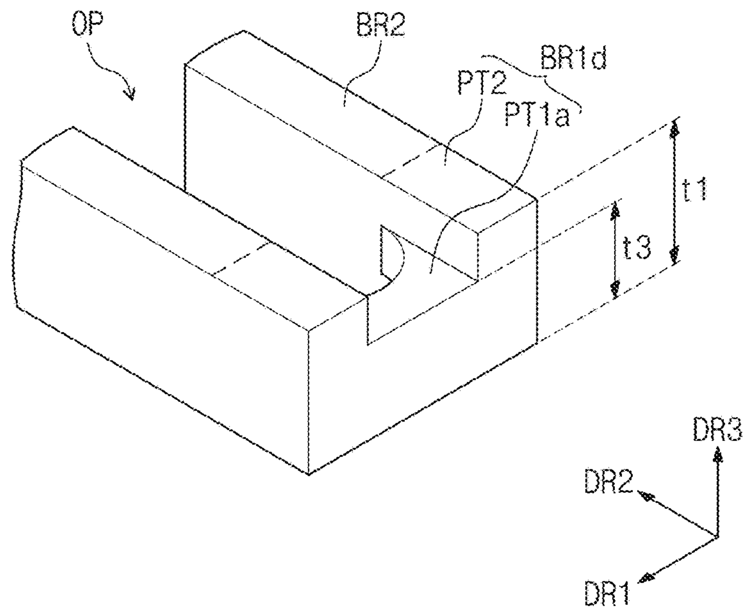
Figure 16C:
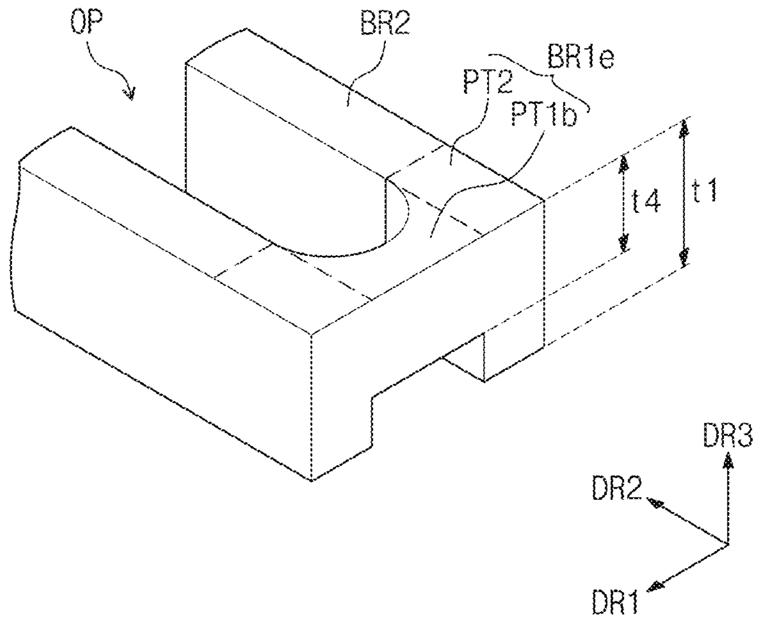

FIGS. 16A to 16C are views illustrating first branch parts according to other embodiments of the present disclosure. FIGS. 16A to 16C are perspective views of a portion of a folding part PLF.

Because openings OP and second branch parts BR2 in FIGS. 16A to 16C are substantially the same as the openings OP and the second branch parts BR2 in FIG. 12, description thereof will be omitted or made briefly.

Referring to FIGS. 16A to 16C, thicknesses of first branch parts BR1*c*, BR1*d*, and BR1*e* may be variable. Thicknesses of portions of the first branch parts BR1*c*, BR1*d*, and BR1*e* may be less than thicknesses of the second branch parts BR2.

The first branch parts BR1*c*, BR1*d*, and BR1*e* may include first portions PT1, PT1*a*, and PT1*b* and second portions PT2. The first portions PT1, PT1*a*, and PT1*b* may be located between the second portions PT2 spaced apart from each other in a first direction DR1.

Upper surfaces of the first portions PT1, PT1*a*, and PT1*b* and upper surfaces of the second portions PT2 may have a step difference from each other. The upper surfaces of the first portions PT1, PT1*a*, and PT1*b* and the upper surfaces of the second portions PT2 will be described in detail below.

Referring to FIG. 16A, a second thickness t2 defined as a thickness of the first portion PT1 may be less than a first thickness t1 defined as a thickness of each of the second portions PT2. A height of the upper surface of the first portion PT1 may be less than a height of the upper surface of each of the second portions PT2. A height of a lower surface of the first portion PT1 may be greater than a height of a lower surface of each of the second portions PT2.

The second thickness t2 of the first portion PT1 may be less than the first thickness t1 of each of the second portions PT2, and areas of the first branch parts BR1*c* may thus be reduced. Accordingly, when an electronic device ED (see FIG. 1) is folded, a difference in the amount of possible deformation between the first branch parts BR1*c* and the second branch parts BR2 may be reduced.

Referring to FIG. 16B, a third thickness t3 defined as a thickness of the first portion PT1*a* may be less than a first thickness t1 defined as a thickness of each of the second portions PT2. A height of the upper surface of the first portion PT1*a* may be less than a height of the upper surface of each of the second portions PT2. A lower surface of the first portion PT1*a* and a lower surface of each of the second portions PT2 may be located on the same plane.

The third thickness t3 of the first portion PT1*a* may be less than the first thickness t1 of each of the second portions PT2, and areas of the first branch parts BR1*d* may thus be reduced. Accordingly, when an electronic device ED (see FIG. 1) is folded, a difference in the amount of possible deformation between the first branch parts BR1*d* and the second branch parts BR2 may be reduced.

Referring to FIG. 16C, a fourth thickness t4 defined as a thickness of the first portion PT1*b* may be less than a first thickness t1 defined as a thickness of each of the second portions PT2. The upper surface of the first portion PT1*b* and the upper surfaces of the second portions PT2 may be located on the same plane. A lower surface of the first portion PT1*b* may be at a position that is higher than a lower surface of each of the second portions PT2.

The fourth thickness t4 of the first portion PT1*b* may be less than the first thickness t1 of each of the second portions PT2, and areas of the first branch parts BR1*e* may thus be reduced. Accordingly, when an electronic device ED (see FIG. 1) is folded, a difference in the amount of possible deformation between the first branch parts BR1*e* and the second branch parts BR2 may be reduced.

Referring to FIGS. 16A to 16C, the thicknesses of portions of the first branch parts BR1*c*, BR1*d*, and BR1*e* may be less than the thicknesses of the second branch parts BR2, and a difference in the amount of possible deformation between the first branch parts BR1*c*, BR1*d*, and BR1*e* and the second branch parts BR2 may thus be reduced. Accordingly, pressure applied to a rear surface of the display panel DP (see FIG. 9) by the first branch parts BR1*c*, BR1*d*, and BR1*e* and the second branch parts BR2 may be dispersed. Thus, stains ST (FIG. 14C) may on the rear surface of the electronic panel (see FIG. 9) may be avoided, thereby reducing or preventing the likelihood of a defect of the electronic device ED (see FIG. 1).

According to one or more embodiments of the present disclosure, a supporting plate located below a display panel may include a first branch part and a second branch part. Because a width in a first direction or a thickness of the first branch part may be adjusted, a difference in the amount of possible deformation between the first branch part and the second branch part may be reduced when a display device is folded. Accordingly, a difference between pressure applied to a rear surface of the display panel by the first branch part and the second branch part may be reduced, and a stain of the supporting plate may not be left on the rear surface of the display panel. Thus, visibility of the stain of the supporting plate from outside the display panel may be reduced or prevented.

Although description has been made with reference to the embodiments of the present disclosure, it is understood that the present disclosure should not be limited to these embodiments, but various changes and modifications may be made by one ordinary skilled in the art within the spirit and scope of the present disclosure as hereinafter claimed. In addition, embodiments disclosed in the present disclosure are not intended to limit the technical spirit of the present disclosure, and all technical ideas within the scope of the following claims and their equivalents should be construed as being included in the scope of the present disclosure.

What is claimed is:

1. A display device comprising:

a display panel comprising a first non-folding region, a folding region, and a second non-folding region arranged in a first direction; and a supporting plate below the display panel, and comprising:

a portion overlapping the folding region, and defining openings arranged in the first direction and in a second direction crossing the first direction; and a first branch part between adjacent ones of the openings adjacent in the second direction, and having a varying width in the first direction, or a varying thickness in a third direction crossing a plane defined by the first direction and the second direction.

2. The display device of claim 1, wherein the width of the first branch part in the first direction becomes smaller toward a center of the first branch part between the adjacent ones of the openings adjacent in the second direction.

3. The display device of claim 2, wherein the openings have a shape corresponding to two sides of the first branch part opposed in the first direction.

4. The display device of claim 2, wherein a dummy opening is defined in the center of the first branch part.

5. The display device of claim 4, wherein the first branch part comprises sub branch parts symmetrical to each other in the first direction with respect to the dummy opening, and wherein a width of the sub branch parts in the first direction becomes smaller toward a center of the dummy opening.

6. The display device of claim 1, wherein a dummy opening is defined in a center of the first branch part between the adjacent ones of the openings adjacent in the second direction.

7. The display device of claim 1, wherein the supporting plate further comprises a second branch part between other adjacent ones of the openings adjacent in the first direction.

8. The display device of claim 7, wherein a thickness of the first branch part is less than a thickness of the second branch part.

9. The display device of claim 8, wherein an upper surface of the first branch part is lower than an upper surface of the second branch part.

10. The display device of claim 8, wherein a lower surface of the first branch part is higher than a lower surface of the second branch part.

11. The display device of claim 8, wherein an upper surface of the first branch part is lower than an upper surface of the second branch part, and wherein a lower surface of the first branch part is higher than a lower surface of the second branch part.

12. A display device comprising:

a display panel comprising a first non-folding region, a folding region, and a second non-folding region arranged in a first direction; and a supporting plate below the display panel, and comprising:

a portion overlapping the folding region, and defining openings in the first direction and in a second direction crossing the first direction; and a first branch part between adjacent ones of the openings adjacent in the second direction, and having an area of a cross section viewed in the second direction becoming smaller toward a center of the first branch part that is between the adjacent ones of the openings.

13. The display device of claim 12, wherein a width of the first branch part in the first direction becomes smaller toward the center of the first branch part.

14. The display device of claim 13, wherein the first branch part comprises sub branch parts spaced apart from each other in the first direction, and wherein a dummy opening is defined by the sub branch parts.

15. The display device of claim 12, wherein two sides of the first branch part opposed in the first direction are parallel to the second direction, and wherein a dummy opening is defined in the center of the first branch part.

16. The display device of claim 12, wherein the supporting plate further comprises a second branch part between other adjacent ones of the openings adjacent in the first direction.

17. The display device of claim 16, wherein a thickness of the first branch part is less than a thickness of the second branch part.

18. The display device of claim 17, wherein an upper surface of the first branch part is lower than an upper surface of the second branch part.

19. The display device of claim 17, wherein a lower surface of the first branch part is higher than a lower surface of the second branch part.

20. The display device of claim 17, wherein a height of an upper surface of the first branch part is less than a height of an upper surface of the second branch part, and wherein a lower surface of the first branch part is higher than a lower surface of the second branch part.

* * * * *